(12) United States Patent
Xianyu et al.

(10) Patent No.: US 7,482,648 B2
(45) Date of Patent: Jan. 27, 2009

(54) ELECTRONIC DEVICE AND METHOD OF MANUFACTURING THE SAME

(75) Inventors: Wenxu Xianyu, Yongin-si (KR); Takashi Noguchi, Seongnam-si (KR); In-kyeong Yoo, Suwon-si (KR); Young-soo Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 11/024,469

(22) Filed: Dec. 30, 2004

(65) Prior Publication Data
US 2005/0139882 A1 Jun. 30, 2005

(30) Foreign Application Priority Data
Dec. 30, 2003 (KR) .............................. 2003-100399

(51) Int. Cl.
*H01L 31/119* (2006.01)
(52) U.S. Cl. ..................... 257/295; 257/295; 438/3
(58) Field of Classification Search ............... 257/295, 257/296, E27.104, E29.164, E29.272, E21.208, 257/E21.436, E21.663, E21.664; 365/63, 365/65, 109, 117, 49.13; 438/3–5
See application file for complete search history.

(56) References Cited

U.S. PATENT DOCUMENTS

| | | | | | |
|---|---|---|---|---|---|
| 5,835,396 | A | * | 11/1998 | Zhang | 365/51 |
| 6,208,547 | B1 | * | 3/2001 | Ooishi | 365/51 |
| 6,242,298 | B1 | * | 6/2001 | Kawakubo | 438/239 |
| 7,042,749 | B2 | * | 5/2006 | Nejad et al. | 365/63 |
| 2003/0117835 | A1 | * | 6/2003 | Kim et al. | 365/158 |
| 2004/0065913 | A1 | * | 4/2004 | Shimada et al. | 257/296 |
| 2004/0170045 | A1 | * | 9/2004 | Nishihara | 365/65 |

FOREIGN PATENT DOCUMENTS

| JP | 11-340419 | * 12/1999 |
|---|---|---|
| KR | 2001-0005983 | 1/2001 |

* cited by examiner

*Primary Examiner*—Steven Loke
*Assistant Examiner*—Tram H Nguyen
(74) *Attorney, Agent, or Firm*—Lee & Morse, P.C.

(57) ABSTRACT

In an electronic device, and a method of manufacturing the same, the electronic device includes a first substrate, a first lower capacitor on the first substrate, a first lower switching element on the first lower capacitor, and a second substrate on the first lower switching element. The electronic device may further include a second lower switching element which is isolated from the first lower capacitor, and an upper capacitor on the second substrate, the lower electrode of the upper capacitor being connected to the second lower switching element.

56 Claims, 22 Drawing Sheets

ELECTRONIC DEVICE AND METHOD OF MANUFACTURING THE SAME

BACKGROUND OF THE INVENTION

1. Field of the Invention

The present invention relates to an electronic device and a method of manufacturing the same. More particularly, the present invention relates to an electronic device in which a functional element and a switching element are bonded vertically, and a method of manufacturing the same.

2. Description of the Related Art

Among electronic devices, memory devices are used in almost all electronic equipment. Demand for nonvolatile memory devices continues to increase.

Nonvolatile memory devices include a ferroelectric random access memory (FRAM). An FRAM includes one metal oxide semiconductor (MOS) transistor and one ferroelectric capacitor. The ferroelectric capacitor includes a lower electrode, a ferroelectric layer and an upper electrode, which are stacked in sequence. The ferroelectric layer is stacked on the lower electrode in an amorphous state. Thus, after the ferroelectric layer is formed, an annealing process is performed to crystallize the ferroelectric layer. Although the annealing process is performed differently depending on the kind of the ferroelectric layer used, the annealing process is generally performed in an oxygen atmosphere at a temperature of 600° C. or more.

In a conventional FRAM, the ferroelectric capacitor and the MOS transistor are connected through a conductive plug. A diffusion barrier layer, for example, a titanium nitride (TiN) layer, is formed between the conductive plug and the lower electrode of the ferroelectric capacitor in order to prevent impurities from being diffused from the conductive plug upwards.

The diffusion barrier layer is oxidized during the annealing process for crystallization of the ferroelectric layer. Thus, a gap may be formed between the conductive plug and the lower electrode.

Also, since the conventional FRAM is formed using CMOS processes, it is difficult to form a transparent FRAM, thus limiting the applications of the conventional FRAM. For example, a smart card in which the conventional FRAM is embedded can provide no functions other than data storage.

Further, since the conventional FRAM is formed using high temperature processes, elements that have already been formed may be damaged during the high temperature processes.

SUMMARY OF THE INVENTION

The present invention is therefore directed to an electronic device and a method of manufacturing the same, which substantially overcome one or more of the problems due to the limitations and disadvantages of the related art.

It is therefore a feature of an embodiment of the present invention to provide an electronic device having numerous applications.

It is another feature of an embodiment of the present invention to provide an electronic device having a simplified manufacturing process.

It is yet another feature of an embodiment of the present invention to provide an electronic device having a high degree of integration.

It is still another feature of an embodiment of the present invention to provide a method of manufacturing such an electronic device.

At least one of the above and other features and advantages of the present invention may be realized by providing an FRAM including a first substrate, a first lower capacitor on the first substrate, a first lower switching element on the first lower capacitor, and a second substrate on the first lower switching element.

The first lower capacitor may include a first electrode, a ferroelectric layer and a second electrode, which are sequentially stacked on the first substrate, the second electrode being perpendicular to the first electrode.

The first lower switching element may be a thin film transistor.

A metal line may be between the first lower capacitor and the first lower switching element, the metal line bonding the first lower capacitor to the first lower switching element. The metal line and the first lower switching element may be connected to each other through a conductive plug. A solder bump may be between the metal line and the first lower capacitor.

The first lower switching element may be provided inside an interlayer insulating layer, and a bonding pad may be on each of the interlayer insulating layer and the first lower capacitor.

A second lower switching element may be between the first substrate and the second substrate. The first lower capacitor may be expanded between the first substrate and the second lower switching element, the first lower capacitor being isolated from the second lower switching element.

The first lower switching element may be identical to the second lower switching element.

A bit line may be on the second substrate, the bit line being connected to the first lower switching element. An upper FRAM may be on the second substrate. The upper FRAM may include a first upper capacitor having a lower electrode spaced apart from the bit line, and a first upper switching element stacked on the first upper capacitor. The first upper capacitor may be identical to the first lower capacitor. The first upper switching element may be identical to the first lower switching element. The bit line may be at least two bit lines and the lower electrode of the first upper capacitor may be provided on the second substrate between the at least two bit lines.

An interlayer insulating layer may be between the lower electrode of the first upper capacitor and the second substrate, the interlayer insulating layer covering the bit line. A metal line may be between the first upper capacitor and the first upper switching element, the metal line bonding the first upper capacitor to the first upper switching element. A conductive plug may be connecting the metal line and the first upper switching element.

The first upper switching element may be formed inside an interlayer insulating layer, and each of the interlayer insulating layer and the first upper capacitor may include a bonding pad.

A third substrate may be on the first upper switching element. A bit line may be on the third substrate, the bit line being connected to the first upper switching element.

A second lower switching element may be between the first substrate and the second substrate, the bit line being further connected to the second lower switching element. A capacitor may be on the second substrate, and may include a lower electrode which is isolated from the bit line and being connected to the second lower switching element. The bit line may be at least two bit lines and the lower electrode of the upper capacitor may be provided on the second substrate between the at least two bit lines. An area in which the first and second lower switching elements are connected to the bit line may have an expanded portion, and the bit line passes over the expanded portion. An area in which the second lower switching element is connected to the upper capacitor may have an expanded portion, and the lower electrode may pass over the expanded portion. The bit line may have a protrusion, the bit line being connected to the first and second lower switching elements through the protrusion. The lower electrode of the upper capacitor may have a protrusion, the lower electrode being connected to the second lower switching element through the protrusion. The bit line may pass over the first and second switching elements and detour around a region in which the lower electrode and the second switching element are connected to each other.

An interlayer insulating layer may be between the lower electrode of the upper capacitor and the second substrate, the interlayer insulating layer covering the bit line. The lower electrode may be parallel to the bit line and passes over the bit line.

An upper FRAM may be on the upper capacitor, the upper FRAM being isolated from the upper capacitor. The upper FRAM may include a first capacitor and a first switching element stacked on the first capacitor. A third substrate may be on the first switching element. A second switching element may be between the third substrate and the first capacitor, the second switching being isolated from the first capacitor. A bit line may be on the third substrate and connected to the first and second switching elements. A second capacitor may be on the third substrate and connected to the second switching element, the second capacitor being isolated from the bit line.

At least one of the above and other features and advantages of the present invention may be realized by providing an electronic device, including a switching element on a first substrate and a functional element on a second substrate and connected to the switching element.

The switching element and the functional element may be connected to each other through a conductive material. The switching element may be a transistor. The functional element may be one of a storage medium, a liquid crystal display (LCD), and a transistor. The storage medium may be a capacitor or a resistor.

The switching element and the functional element may be paired, and a plurality of pairs of the switching element and the functional element may be formed in a stacked structure. The switching element of the stacked structure may be provided below the functional element.

At least one of the above and other features and advantages of the present invention may be realized by providing a method of manufacturing a ferroelectric random access memory (FRAM), including (a) forming a first capacitor on a first surface of a first substrate, (b) forming a first switching element on a first surface of a second substrate, and (c) bonding the first capacitor to the first switching element.

Forming the first capacitor may include forming a first electrode on the first surface of the first substrate, forming a ferroelectric layer on the first electrode, and forming a second electrode on the ferroelectric layer, the second electrode being crossed with the first electrode. A first bonding pad and a first alignment key may be formed on the ferroelectric layer.

Between forming the first switching element and bonding the first capacitor to the first switching element, the method may further include forming an interlayer insulating layer on the first surface of the second substrate, the interlayer insulating layer covering the first switching element, forming a via hole in the interlayer insulating layer, the via hole exposing the first switching element, filling the via hole with a conductive plug, and forming a metal line on the interlayer insulating layer, the metal line being connected to the conductive plug. Forming the via hole may include forming a second bonding pad and a second alignment key.

Bonding the first capacitor to the first switching element may include clamping a second surface of the first substrate, the second surface of the first substrate facing the first surface thereof, clamping a second surface of the second substrate, the second surface of the second substrate facing the first surface thereof, aligning the first and second substrates to dispose the first capacitor and the first switching element at a bonding position, pressurizing and contacting the first capacitor and the first switching element, heating the pressurized and contacted portion of the first capacitor and the first switching element, and releasing the second surfaces of the first and second substrates. After the releasing, at least one of the first substrate and the second substrate may be thinned.

The method may further include annealing the pressurized and contacted resultant structure in an ultra high vacuum state, thereby heating the pressurized and contacted portion of the first capacitor and the first switching element.

The method may further include irradiating the contacted portion of the first capacitor and the first switching element, thereby heating the contacted portion of the first capacitor and the first switching element. A mask may be placed between a light source used for irradiating and the second surface of the second substrate, the mask including a light transmitting area, which corresponds to the contacted portion, and a light shielding area which corresponds to other areas.

A bit line may be formed on the second surface of the second substrate, the bit line being connected to the first switching element. An FRAM layer may be formed on the second surface of the second substrate isolated from the bit line. Forming the FRAM layer may include forming an upper capacitor on the second face of the second substrate isolated from the bit line, and forming an upper switching element on the upper capacitor. An interlayer insulating layer may be provided between the upper capacitor and the second surface of the second substrate, the interlayer insulating layer covering the bit line. A lower electrode of the upper capacitor may be formed on the second surface of the second substrate, the lower electrode being isolated from the bit line.

Bonding the first capacitor and the first switching element may include using a solder bump.

A second switching element may be formed on the first surface of the second substrate. A bit line may be formed on the second surface of the second substrate, the bit line being connected to the first and second switching elements. An upper capacitor may be formed on the second surface of the second substrate, the upper capacitor being isolated from the bit line and being connected to the second switching element. An interlayer insulating layer may be provided between the upper capacitor and the second surface of the second substrate, the interlayer insulating layer covering the bit line. A lower electrode of the upper capacitor may be formed on the second surface, the lower electrode being isolated from the bit line.

The method further include forming an interlayer insulating layer on the upper capacitor, and forming an FRAM layer on the interlayer insulating layer. Forming the FRAM layer may include forming a capacitor on the interlayer insulating layer, forming a switching element on a first surface of a third substrate, and bonding the switching element to the capacitor.

Forming the FRAM layer may include forming a lower capacitor on the interlayer insulating layer, forming a first switching element to be connected to the lower capacitor and a second switching element to be isolated from the lower capacitor on a first surface of a third substrate, bonding the first switching element to the lower capacitor, forming a bit line on a second surface of the third substrate, the second surface of the third substrate facing the first surface thereof, the bit line being connected to the first and second switching elements, and forming an upper capacitor on the second surface of the third substrate, the upper capacitor being connected to the second switching element, a lower electrode of the upper capacitor being isolated from the bit line. Bonding the first switching element to the lower capacitor may include contacting a metal line connected to the first switching element through a conductive plug to the lower capacitor.

At least one of the above and other features and advantages of the present invention may be realized by providing a method of manufacturing an electronic device, including forming a switching element on a first substrate, forming a functional element on a second substrate, and bonding the switching element to the functional element.

Bonding the switching element and the functional element may form a pair, and a plurality of pairs of the switching element and the functional element may be further formed on the resultant bonded structure.

The method may further include forming a second switching element using a functional element area of the resultant bonded structure as a substrate, forming a second functional element on an separate substrate, and bonding the second functional element to the second switching element.

The method of manufacturing the FRAM according to the present invention can be simplified, since the switching element part and the capacitor part are separately formed and then bonded with each other.

Further, since a diffusion barrier layer is unnecessary, it is possible to eliminate the oxidation problem. As a result, high quality FRAM can be obtained. Further, since the thin film transistors and the ferroelectric capacitors may be formed on a transparent substrate, the transparency of an electronic device can be realized, thereby increasing its usefulness for a variety of applications.

BRIEF DESCRIPTION OF THE DRAWINGS

The above and other features and advantages of the present invention will become more apparent to those of skill in the art by describing in detail exemplary embodiments thereof with reference to the attached drawings in which.

DETAILED DESCRIPTION OF THE INVENTION

Figure 1:
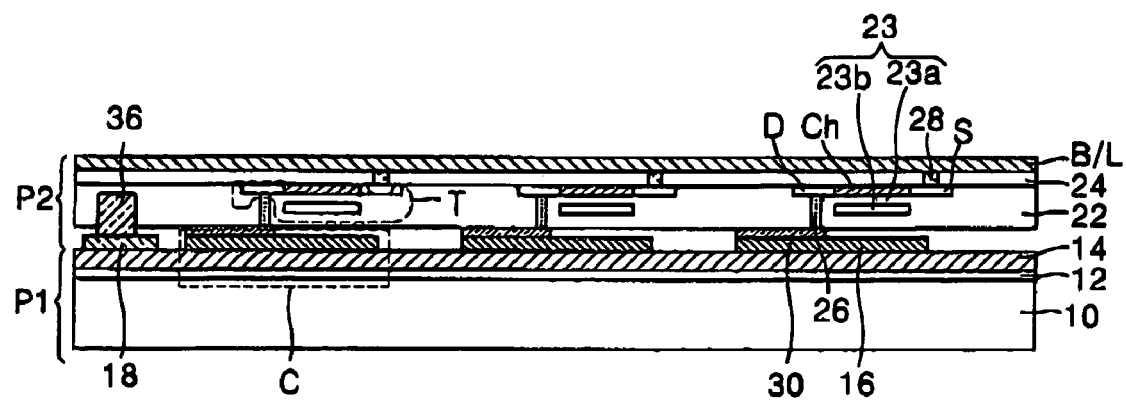
FIG. 1 illustrates a cross-sectional view of an electronic device according to a first embodiment of the present invention.

Korean Patent Application No. 2003-100399, filed on Dec. 30, 2003, in the Korean Intellectual Property Office, entitled: "Electronic Device and Method of Manufacturing the Same," is incorporated by reference herein in its entirety.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will be omitted.

As an exemplary electronic device, a memory device, e.g., an FRAM, and a method of manufacturing the same will be described.

The technical spirit of the FRAM and the method of manufacturing the same can be applied to other electronic devices, e.g., an electronic device in which switching elements and functional elements provided on different substrates are bonded to one another, and also methods of manufacturing the electronic devices. The functional elements may be a memory medium, a liquid crystal display (LCD) or a transistor. Also, the switching element and the function element may be paired. A plurality of such pairs may be stacked.

First, an FRAM will now be described.

FIRST DEVICE EMBODIMENT

Referring to FIG. 1, an FRAM according to a first device embodiment of the present invention includes a capacitor part P1 and a switching element part P2, which are bonded with each other. The capacitor part P1 includes a capacitor C provided below the switching element part P2. The capacitor C serves as the functional element for the FRAM. The capacitor part P1 includes a first substrate 10. First electrodes 12, a dielectric layer 14, and second electrodes 16 are sequentially stacked on the first substrate 10, thereby forming the capacitor C. There are a plurality of first electrodes 12 and second electrodes 16 defining each capacitor C. The first and second electrodes 12 and 16 are perpendicular to one another. The first electrode 12 and the second electrode 16 are an upper electrode and a lower electrode of the capacitor C, respectively.

The first substrate 10 may be a transparent substrate, e.g., a sapphire substrate or a glass substrate. The first and second electrodes 12 and 16 may be transparent electrodes. For example, the first and second electrodes 12 and 16 may be formed of indium tin oxide (ITO), platinum (Pt), iridium (Ir), or iridium oxide ($IrO_2$). The dielectric layer 14 may be a transparent ferroelectric layer, e.g., a lead lanthanum zirconate titanate PLZT layer, a lead zirconate titanate PZT layer or a $Bi_4Ti_3O_{12}$ (BIT) layer.

In addition to the second electrodes 16, a first bonding pad 18 is formed on the dielectric layer 14. The first bonding pad 18 is spaced apart from the second electrodes 16. The first bonding pad 18 functions to firmly bond the switching element part P2 to the capacitor part P1. The first bonding pad 18 is bonded to a second bonding pad 36 provided in the switching element part P2. The second bonding pad 36 is provided at a position facing with the first bonding pad 18. The first bonding pad 18 and/or the second bonding pad 36 may be formed of aluminium (Al), copper (Cu), titanium (Ti), chromium (Cr), tungsten (W), gold (Au), silver (Ag), or nickel (Ni).

The switching element part P2 includes an interlayer insulating layer 22 below a second substrate 24 and a bit line B/L above the second substrate 24. A plurality of switching elements T is embedded in the interlayer insulating layer 22. Each switching element T may be a thin film transistor having a drain region D, a source region S and a channel region Ch, and having a gate stack structure 23 formed by sequentially stacking a gate insulating layer 23a and a gate electrode 23b. Metal lines 30 are provided in a bottom surface of the interlayer insulating layer 22, each metal line corresponding to a switching element T. The metal lines 30 may be formed of Al, Cu, Ti, and ITO. Drain regions D of the switching elements T are connected to the metal lines 30 through conductive plugs 26. The metal lines 30 are directly bonded to the second electrodes 16 of the capacitor part P1 in one-to-one correspondence. The switching elements T of the switching element part P2 and the capacitors C of the capacitor part P1 are stacked vertically and bonded to form pairs. Due to one-to-one bonding of the metal lines 30 and the second electrodes 16, the switching element part P2 and the capacitor part P1 can be maintained in the bonded state.

To compensate for any weakening of the bonding force between the metal lines 30 and the second electrodes 16, the second bonding pad 36 may be provided in the interlayer insulating layer 22 of the switching element part P2 at a position corresponding to the first bonding pad 18 of the capacitor part P1 in order to assure the bonding of the capacitor part P1 with the switching element part P2. The second bonding pad 36 is provided at a position facing with the first bonding pad 18 and the two bonding pads 18 and 36 are bonded with each other.

The bit line B/L is connected to a source region S of the switching element T through the conductive plug 28, which passes through the interlayer insulating layer 22 and the second electrode 24.

Although not shown in FIG. 1, an alignment mark is formed on the capacitor part P1 and the switching element part P2 in order to obtain accurate alignment between the capacitor part P1 and the switching element part P2. A buffer film may be further included in order to increase an adhesive force between the first substrate 10 and the first electrode 12.

SECOND DEVICE EMBODIMENT

A second device embodiment includes two or more FRAM stacked layers. At least one of the stacked FRAM layers may be the same as the FRAM shown in FIG. 1.

Figure 2:
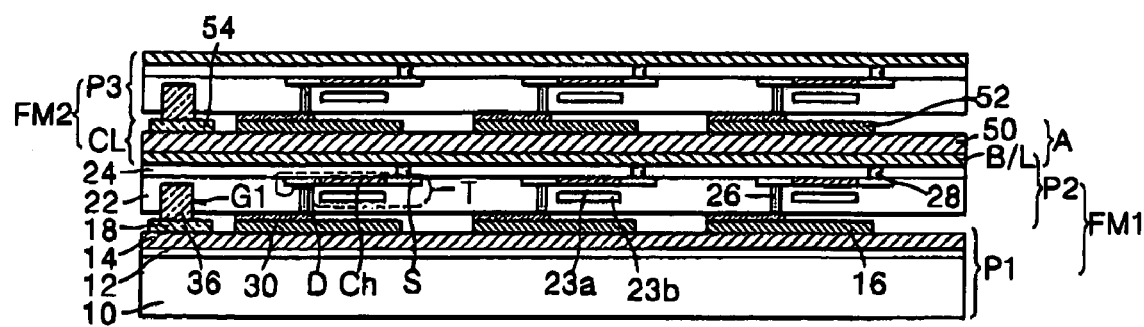
FIG. 2 illustrates a cross-sectional view of an electronic device according to a second embodiment of the present invention.

Referring to FIG. 2, an FRAM according to the second device embodiment of the present invention may include first and second FRAM layers FM1 and FM2, which are stacked in sequence. A structure of the first FRAM layer FM1 is identical to that of the FRAM of FIG. 1, which includes the capacitor part P1 and the switching element part P2. The second FRAM layer FM2 includes a capacitor layer CL and a switching element part P3 which are sequentially stacked.

The capacitor layer CL includes a lower electrode 48 (shown in FIG. 3), a ferroelectric layer 50, and an upper electrode 52, which are sequentially stacked. A third bonding pad 54 is provided on the ferroelectric layer 50, preferably at an edge portion. The switching element part P3 may be identical to the switching element part P2 of the first FRAM layer FM1. However, the switching element part P3 may have a different structure from the switching element part P2 or may have different components, but the same structure as the switching element part P2.

Figure 3:
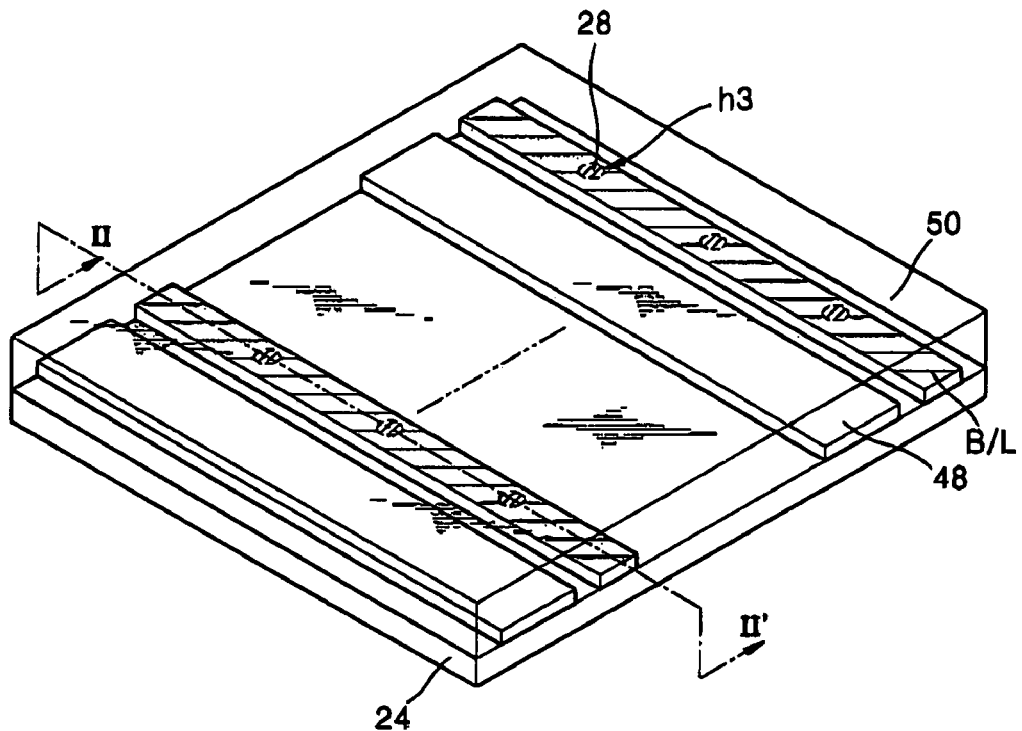
FIG. 3 illustrates a perspective view of a stacked structure A of FIG. 2, which includes a second substrate, a bit line and a lower electrode.

FIG. 3 illustrates a perspective view of a stacked structure A of FIG. 2 that includes the second substrate 24 of the switching element part P2, multiple, i.e., at least two, bit lines B/L and the capacitor layer CL.

Referring to FIG. 3, the lower electrode 48 of the capacitor layer CL is positioned in parallel with the bit lines B/L on the second substrate 24 between the bit lines B/L. In FIG. 2, the stacked structure A is a cross-sectional view cut away along the line II-II' of FIG. 3.

To increase capacitance of the capacitor, an area of the lower electrode should be as wide as possible. Thus, the lower electrode 48 provided between the bit lines B/L should be as wide as possible.

In FIG. 2, a layout of the bit lines B/L of the switching element part P2 contained in the first FRAM layer FM1 may be identical to that of the bit lines B/L of the switching element part P3 contained in the second FRAM layer FM2. The layouts of the two bit lines B/L may be different depending on whether the lower electrode 48 is in a same or a different plane, as described below.

The stacked structure of the first and second FRAM layers FM1 and FM2, such as the FRAM according to the second device embodiment of the present invention, may be applied to an electronic device having a stacked structure in which first and second electronic devices are included. The first electronic device may be a switching element and the second electronic device may be a data storage medium, e.g., a capacitor or a resistor, an LCD or a transistor, which is connected to the switching element. The first electronic device may also include a first switching element and a first functional element, and the second electronic device may also include a second switching element connected to the first functional element and a second functional element connected to the second switching element. The second switching element may be a thin film transistor and the second functional element may be the LCD, the data storage medium or the transistor.

THIRD DEVICE EMBODIMENT

Figure 4:
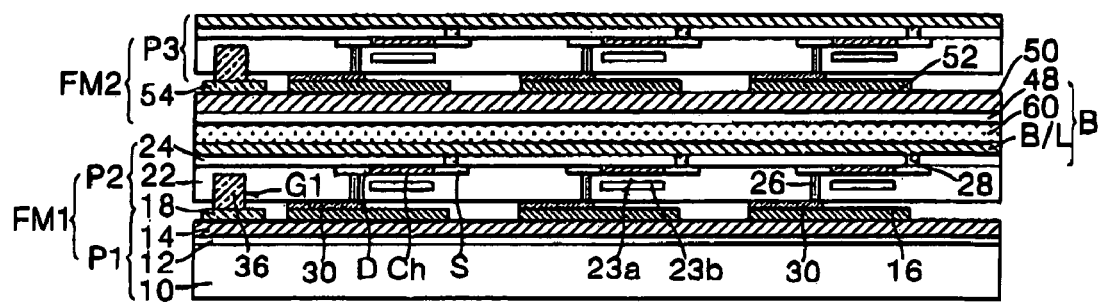
FIG. 4 illustrates a cross-sectional view of an electronic device according to a third embodiment of the present invention.

As shown in FIG. 4, a third device embodiment relates to an FRAM that includes an interlayer insulating layer 60 between a first FRAM layer FM1 and a second FRAM layer FM2. Referring to FIG. 4, since the interlayer insulating layer 60 is formed between the first and second FRAM layers FM1 and FM2, the lower electrode 48 of the second FRAM layer FM2 and the bit line B/L of the first FRAM layer FM1 are provided in different planes.

Figure 5:
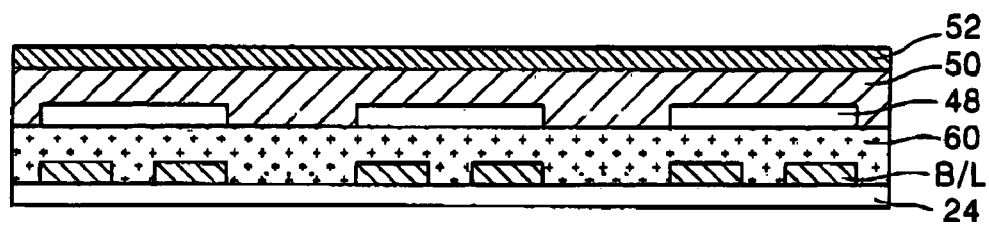
FIG. 5 illustrates a side view of a stacked structure B of FIG. 4.

FIG. 5 illustrates a side view of a stacked structure B of FIG. 4, which includes a portion of the first FRAM layer FM1 and a portion of the second FRAM layer FM2 on respective sides of the interlayer insulating layer 60.

Referring to FIG. 5, a plurality of bit lines B/L are provided on the second substrate 24 and the interlayer insulating layer 60 covers the bit lines B/L. Lower electrodes 48 are formed on the interlayer insulating layer 60. The lower electrodes 48 are arranged in parallel with the bit lines B/L.

In this manner, the lower electrodes 48 and the bit lines B/L are vertically separated by the interlayer insulating layer 60. Thus, areas of the lower electrodes 48 can be larger than in the FRAM of FIG. 2, in which the lower electrodes 48 and the bit lines B/L are provided in the same plane. A capacitance of the capacitor of the FRAM of FIG. 4 is thus larger than that of the capacitor of FIG. 2.

The ferroelectric layer 50 is formed on the interlayer insulating layer 60 and covers the lower electrodes 48. The upper electrode 52 is formed on the ferroelectric layer 50. The upper electrode 52 and the lower electrode 48 are perpendicular to one another.

FOURTH DEVICE EMBODIMENT

A fourth device embodiment relates to an FRAM, in which capacitors C are provided above and below a switching element layer having a plurality of switching elements T. Half of the switching elements T are connected to a lower capacitor and the other half of the switching elements T are connected to an upper capacitor.

Figure 6:
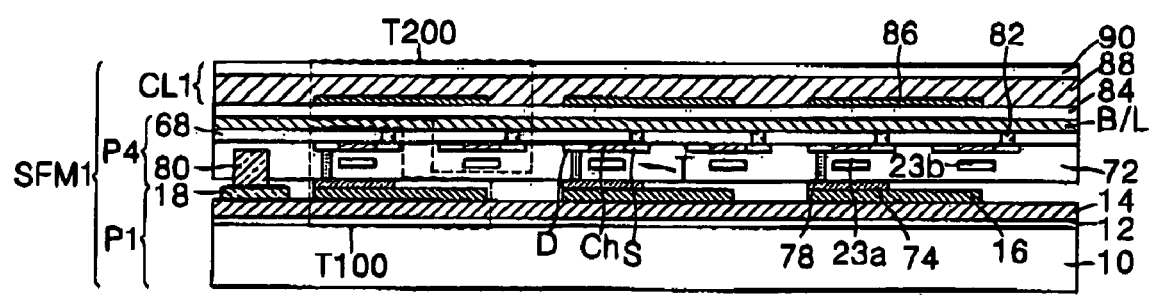
FIG. 6 illustrates a cross-sectional view of an electronic device according to a fourth embodiment of the present invention.

Referring to FIG. 6, an FRAM according to the fourth device embodiment of the present invention includes a first stacked FRAM layer SFM1. The first stacked FRAM layer SFM1 includes the capacitor part P1, a switching element part P4, and a capacitor layer CL1, which are sequentially stacked. The switching element part P4 includes a plurality of switching elements T that are inverted with respect to the capacitor part P1. An interlayer insulating layer 72 covers the switching elements T. A third substrate 68 is formed on the interlayer insulating layer 72 and the bit lines B/L are formed on the third substrate 68. A metal line 74 is provided at a position facing the capacitor part P1 of the interlayer insulating layer 72. The metal line 74 is connected to the drain region D through a conductive plug 78. The number of conductive plugs 78 is equal to half the number of switching elements T. Drain region D of the switching elements T, which does not have a conductive plug 78 associated therewith, is connected to the capacitor layer CL1 through a conductive plug (not shown) formed away from the bit line B/L. The metal line 74 is bonded to the second electrode 16 of the capacitor part P1, i.e., the upper electrode. The switching element part P4 also includes a fourth bonding pad 80, which is bonded with the first bonding pad 18 of the capacitor part P1. A large portion of the fourth bonding pad 80 may be embedded in the interlayer insulating layer 72, with some portion thereof exposed and bonded to the first bonding pad 18. The capacitor layer CL1 includes a lower electrode 86, a ferroelectric layer 88 and an upper electrode 90, which are sequentially formed on an interlayer insulating layer 84.

As described above, the capacitor layer CL1 and the capacitor part P1 are respectively provided above and below the switching element part P4, which includes the switching elements T. Half the switching elements T provided in the switching element part P4 are connected to a lower capacitor layer, i.e., the capacitor part P1, and the remaining switching elements T are connected to an upper capacitor layer, i.e., the capacitor layer CL1. The second electrode 16 of the capacitor part P1 connected to the switching elements T and the lower electrode 86 of the upper capacitor layer CL1 are expanded over the switching elements T, which are connected to the second electrode 16 and the lower electrode 86, and the switching elements T adjacent to the second electrode 16 and the lower electrode 86. A switching element T of the switching element part P4, the first electrode 12 of the capacitor part P1, the ferroelectric layer 14 and the second electrode 16 constitute a first FRAM T100. Another switching element T, which is adjacent to the switching element T of the first FRAM T100, and the capacitor layer CL1 constitute a second FRAM T200. The capacitor layer CL1 of the second FRAM T200 is expanded above the switching element T of the first FRAM T100 and the capacitor part P1 of the first FRAM T100 are expanded below the switching element T of the second FRAM T200. Thus, portions of the first and second FRAMs T100 and T200 overlap. Also, since the second FRAM T200 is provided above the first FRAM T100, the first and second FRAMs T100 and T200 become a stacked structure. The first stacked FRAM layer SFM1 includes a plurality of the first and second FRAMs T100 and T200.

Figure 7:
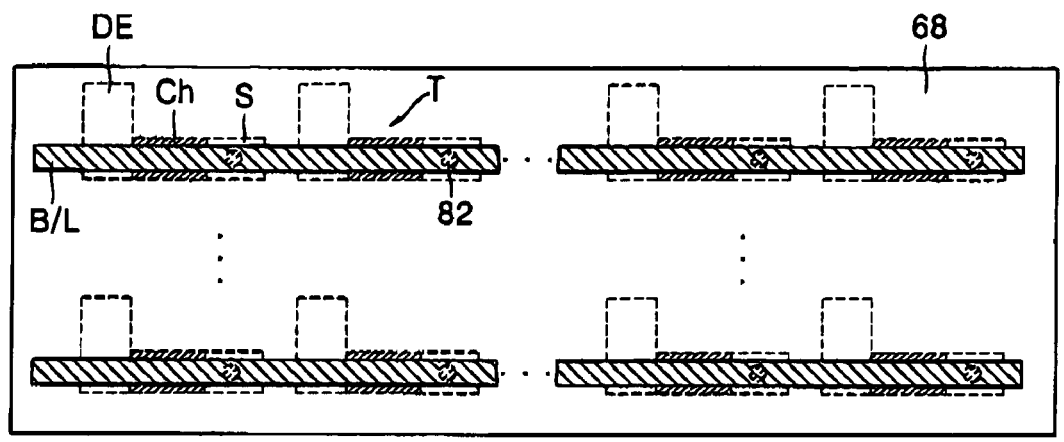
FIG. 7 illustrates a plan view of a shape of a bit line when a drain region of a switching element in FIG. 6 is expanded.
Figure 8:
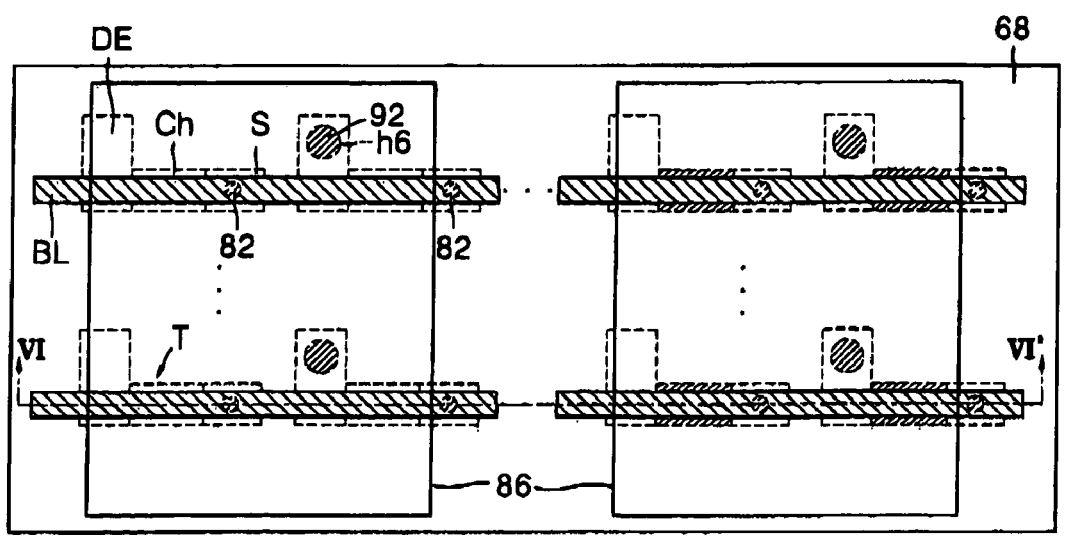
FIG. 8 illustrates a plan view of a shape of a bit line and a lower electrode when a drain region of a switching element in FIG. 6 is expanded.
Figure 9:
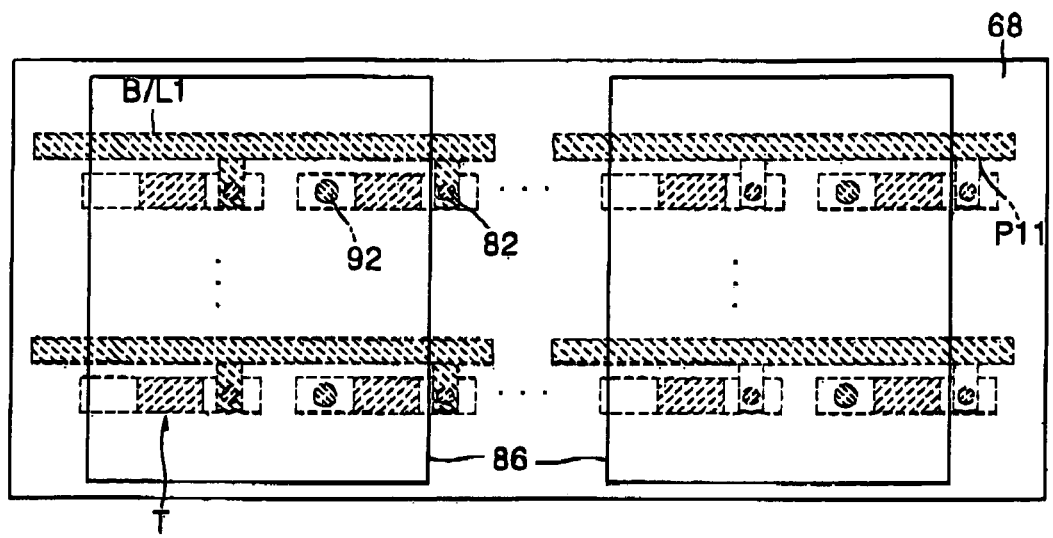
FIG. 9 illustrates a plan view of a shape of a bit line and a lower electrode when a drain region, a source region and a channel region of a switching element are provided in a typical structure.

In the first stacked FRAM layer SFM1, the bit line B/L and the lower electrode 86 of the upper capacitor layer CL1 can have various layouts according to the provided structure of the switching elements T. In FIGS. 7 through 9, examples of various layouts are illustrated. In FIGS. 8 and 9, the interlayer insulating layer 84 is not shown for clarity of illustration.

Referring to FIG. 7, when the drain region D of the switching element T includes an expanded portion DE, the bit line B/L is formed across the remaining portion of the drain region D except for the expanded portion DE, the channel region Ch, and the source region S. As shown in FIG. 8, the lower electrode 86 contacts the expanded portion of the drain region D. Thus, the expanded portion DE of the drain region D prevents the lower electrode 86 and the bit line B/L from being in contact, i.e., the lower electrode 86 and the bit line B/L are isolated from one another, even when the lower electrode 86 is in contact with the drain region D.

Referring to FIG. 8, the lower electrode 86 of the capacitor layer CL1 may be perpendicular to the bit line B/L. In this case, since the lower electrode 86 and the bit line B/L are separated from each other by the interlayer insulating layer 84, the lower electrode 86 can extend over the switching elements T, which are connected thereto through a conductive plug 92, as well as adjacent switching elements T that are not connected thereto. In this case, the lower electrode 86 is connected to the expanded portion of the drain region D through the conductive plug 92. FIG. 6 illustrates a cross-sectional view of the first stacked structure taken along the line VI-VI' of FIG. 8.

FIG. 9 illustrates a layout of a bit line B/L1 and a lower electrode 86 when the drain region D, the source region S and the channel region Ch of the switching element T have a typical structure.

Referring to FIG. 9, when the switching element T has a typical structure, the bit line B/L1 may be spaced apart from and parallel to the switching element T. Since the bit line B/L1 still must be connected to the source region S, the bit line B/L1 includes a protrusion P11 in contact with the source region S. The protrusion P11 is in contact with the source region S of the switching element T through the conductive plug 82. The lower electrode 86 may be perpendicular to the bit line B/L1. The lower electrode 86 is connected to every other drain region D of the switching element T.

Figure 10:
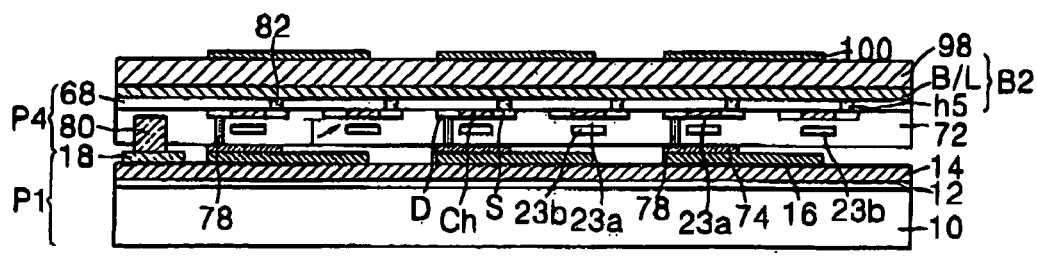
FIG. 10 illustrates a cross-sectional view of the electronic device of FIG. 6, where an interlayer insulating layer, so that a bit line and a lower electrode of the upper capacitor layer are formed on the same plane.

FIG. 10 illustrates a cross-sectional view of the FRAM of FIG. 6, where the interlayer insulating layer 84 is removed, i.e., both the bit line B/L and the lower electrode 86 of FIG. 6 are provided on the third substrate 68.

Referring to FIG. 10, a ferroelectric layer 98 covering the bit line B/L and the lower electrode (not shown) is formed on the switching element part P4. An upper electrode 100 is formed on the ferroelectric layer 98.

When both the lower electrode and the bit line B/L are provided on the third substrate 68, the lower electrode must be formed between the bit lines B/L. Thus, although the lower electrode and the bit line B/L are generally parallel, the layout of the bit line B/L and the lower electrode may be modified depending on the structure of the switching element T.

Figure 11:
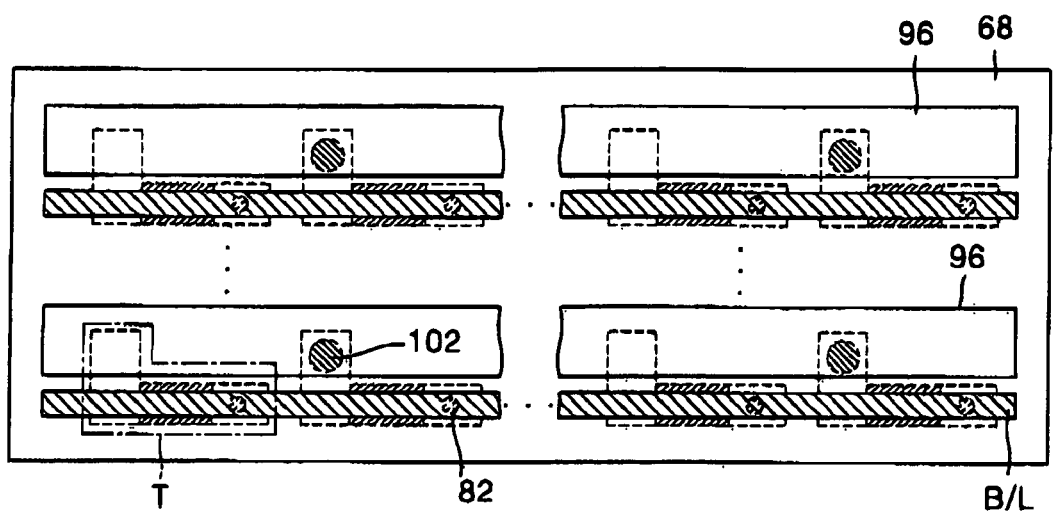
FIG. 11 illustrates a plan view of the electronic device of FIG. 10, in which a bit line and a lower electrode of an upper capacitor layer are formed in the same plane, and in which a drain region of a switching element is expanded.

Specifically, referring to FIG. 11, when the drain region D of the switching element T is expanded in the direction perpendicular to the channel region Ch, the bit line B/L may be provided across the remaining portion of the switching element T except for the expanded portion of the drain region D. The lower electrode 96 may cross and contact the expanded portion of the drain region D every other drain region. The lower electrode 96 is in contact with the drain region D through a conductive plug 102.

Figure 12:
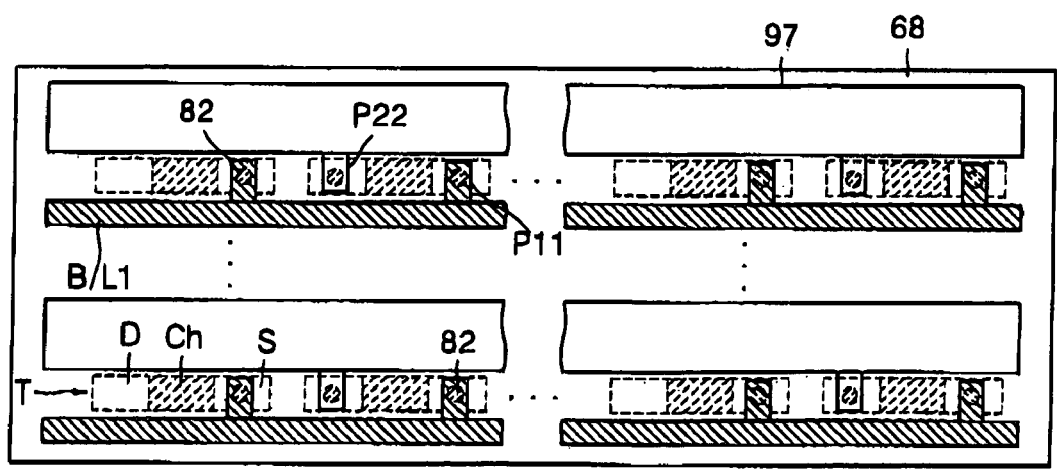
FIGS. 12 and 13 illustrate respective plan views of the electronic device of FIG. 10, in which a bit line and a lower electrode of an upper capacitor layer are formed in the same plane, and in which a drain region, a source region and a channel region of a switching element are provided in a typical structure.

Referring to FIG. 12, when the switching element T has a typical structure, the bit line B/L1 that contacts the source region S is provided on one side of the switching element T, and a lower electrode 97 that contacts the drain region D every other drain region is provided on the other side. The bit line B/L1 is in contact with the source region S through the protrusion P11 and the lower electrode 97 is in contact with the drain region D through a protrusion P22.

Figure 13:
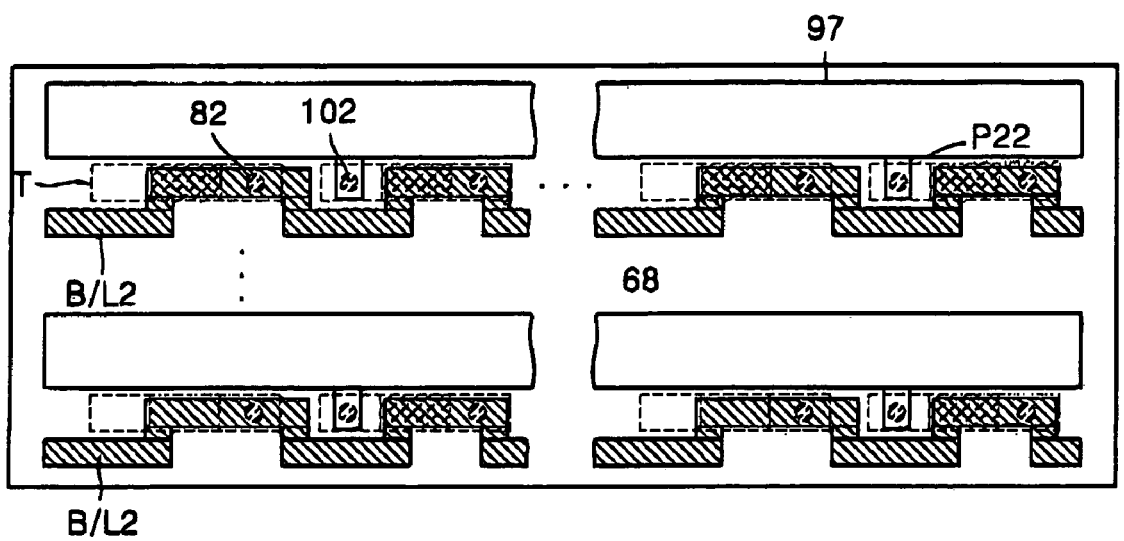

Referring to FIG. 13, when the switching element T has a typical structure, a bit line B/L2 partially crosses over the switching element T, and the lower electrode 97 has the protrusion P22. The bit line B/L2 detours around the drain region D in order to prevent the bit line B/L2 and the lower electrode 97 from contacting each other, i.e., they are isolated from one another.

Figure 14:
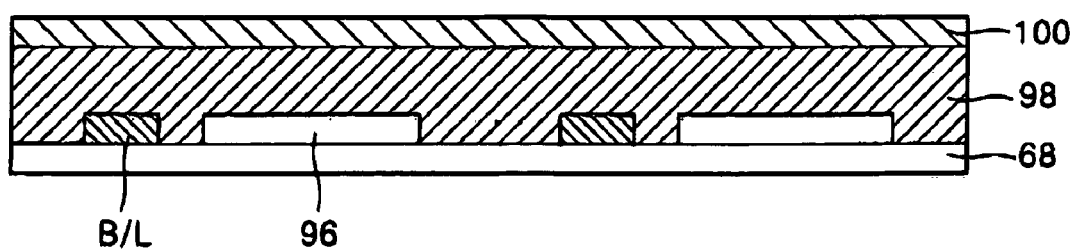
FIG. 14 illustrates a side view of the portion B2 in the electronic device of FIG. 10.

FIG. 14 illustrates a side view of a stacked structure B2 shown in FIG. 10. Referring to FIG. 14, the bit lines B/L are formed on the third substrate 68, and the lower electrodes 96 are formed between the bit lines B/L on the third substrate 68. The bit line B/L replaces the bit line B/L1 in FIG. 12 or the bit line B/L2 in FIG. 13. Also, the lower electrode 96 replaces the lower electrode 97 in FIG. 12 or FIG. 13. The ferroelectric layer 98 on the third substrate 68 covers the bit line B/L and the lower electrode 96. The upper electrode 100 is formed on the ferroelectric layer 98.

FIFTH DEVICE EMBODIMENT

A fifth device embodiment relates to an FRAM having a plurality of stacked FRAM layers.

Figure 15:
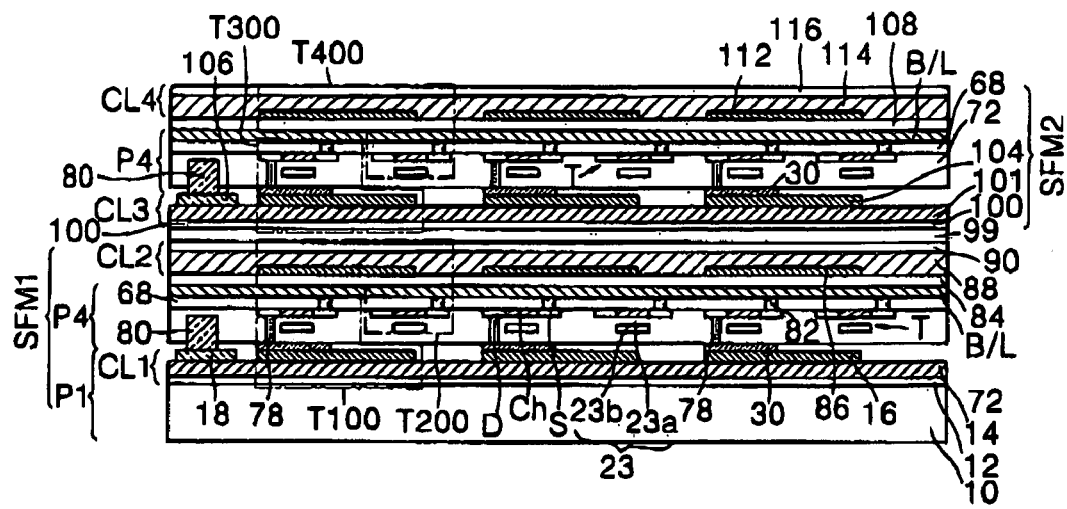
FIG. 15 illustrates a cross-sectional view of an electronic device according to a fifth embodiment of the present invention.

Referring to FIG. 15, the FRAM according to the fifth device embodiment of the present invention includes first and second stacked FRAM layers SFM1 and SFM2, which are stacked in sequence. An interlayer insulating layer 99 is formed between the first and second stacked FRAM layers SFM1 and SFM2. The first stacked FRAM layer SFM1 includes the capacitor part P1, a switching element part P4 and a capacitor layer CL2, which are stacked in sequence. The interlayer insulating layer 84 is formed between the switching element part P4 and the capacitor layer CL2. The second stacked FRAM layer SFM2 includes a capacitor layer CL3, the switching element part P4 and a capacitor layer CL4. An interlayer insulating layer 108 is formed between the switching element part P4 and the capacitor layer CL4. The capacitor layer CL3 includes the lower electrode 100 formed on the interlayer insulating layer 99, a ferroelectric layer 101 formed on the lower electrode 100, and an upper electrode 104 formed on the ferroelectric layer 101. The upper electrode 104 is perpendicular to the lower electrode 100. In addition to the upper electrode 104, a bonding pad 106 is further formed on the ferroelectric layer 101. The bonding pad 106 is bonded with the capacitor layer CL3 and a fourth bonding pad 80, which is provided on the switching element part P4. The capacitor layer CL4 includes a lower electrode 112, a ferroelectric layer 114 covering the lower electrode 112 and an upper electrode 116 formed on the ferroelectric layer 114. Here, the lower electrode 112 is formed on the interlayer insulating layer 108 and is perpendicular to the bit line B/L. The upper electrode 116 is parallel to the bit line B/L.

In FIG. 15, reference numerals T300 and T400 represent third and fourth FRAMs, respectively. The third and fourth FRAMs T300 and T400 may have the same structure as the first and second FRAMs T100 and T200.

Also, third and fourth stacked FRAMS may be further formed on the second stacked FRAM layer SFM2 in FIG. 15.

A method of manufacturing the FRAMs according to embodiments of the present invention will now be described.

FIRST METHOD EMBODIMENT

Figure 16:
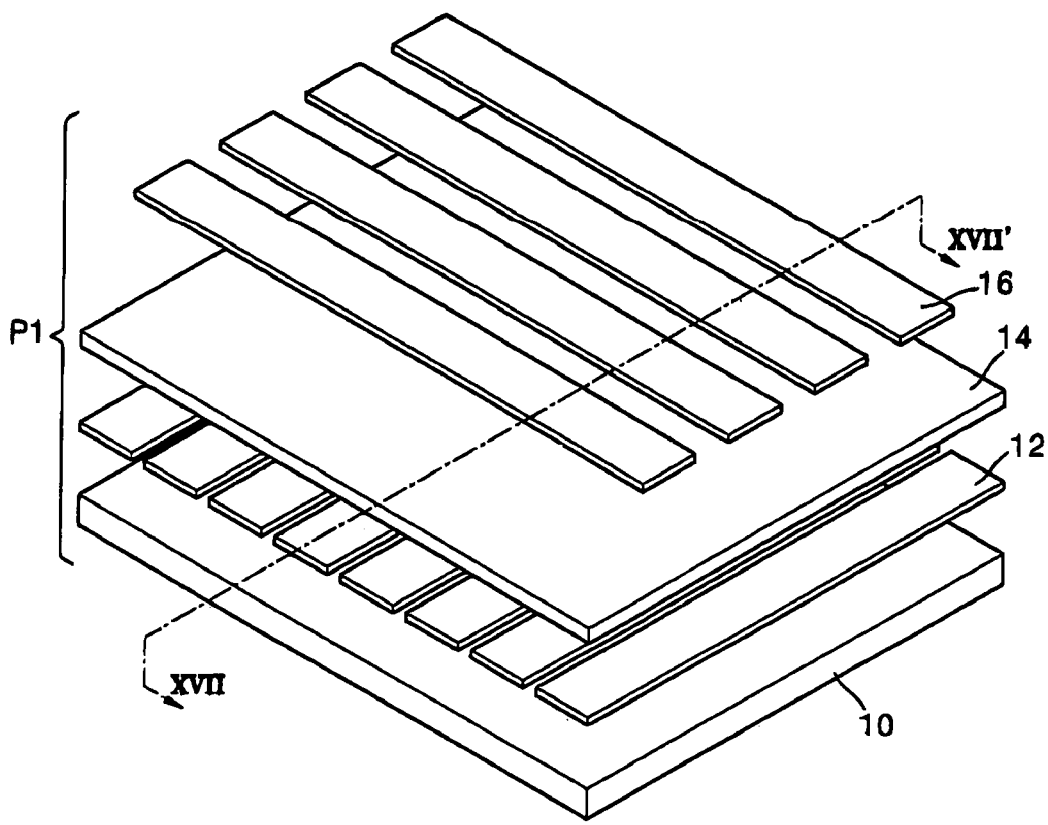
FIG. 16 illustrates a perspective view of a capacitor part.
Figure 17:
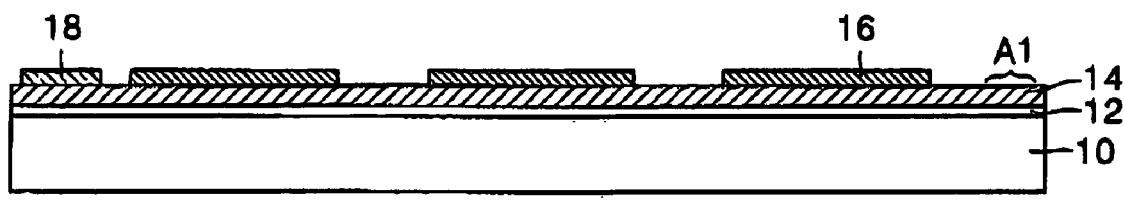
FIGS. 17 through 24 illustrate cross-sectional views of various stages of a method of manufacturing the electronic device according to the first embodiment of the present invention.

FIG. 16 illustrates a perspective view of the capacitor part P1 and FIG. 17 illustrates a cross-sectional view taken along the line XVII-XVII' of FIG. 16.

Referring to FIGS. 16 and 17, the plurality of first electrodes 12 are formed on the first substrate 10. The dielectric layer 14 is formed on the first electrodes 12. The dielectric layer 14 may be formed with a transparent ferroelectric layer. Thereafter, an annealing process is performed for crystallizing the dielectric layer 14. The annealing process may be performed after formation of the first bonding pad 18, which will be described later. Since the annealing process crystallizes the dielectric layer 14, the annealing process may be performed in an oxygen atmosphere and at a high temperature. Because the annealing process is performed on individual objects that have no semiconductor devices, such as transistors, no objects are damaged during the annealing process. After the annealing process, the plurality of second electrodes 16 is formed on the dielectric layer 14. The second electrodes 16 are used as the lower electrodes of the capacitors C, which will be connected to the switching element part P2. The second electrodes 16 are spaced apart from each other by a predetermined interval, and are perpendicular to the first electrodes 12. While the second electrodes 16 are formed, a first alignment key (not shown) may be formed on a first alignment key forming area A1 of the dielectric layer 14, which is spaced apart from the second electrodes 16. The first alignment key may match a second alignment key (not shown), which is formed on a predetermined portion of an interlayer insulating layer 22 of the switching element part P2 which is described later. The first and second alignment keys are used to accurately align the capacitor part P1 and the switching element part P2.

The first bonding pad 18 is formed on the dielectric layer 14 together with the second electrodes 16. The first bonding pad 18 may be formed at an edge portion of the dielectric layer 14, on which the second electrodes 16 are not formed. When a gap between the second electrodes 16 is wide, the first bonding pad 18 may be formed between the second electrodes 16. The first bonding pad 18 may be of a same or greater thickness than the second electrode 16.

After the capacitor part P1 is formed, an additional substrate is prepared and the switching element part P2 of FIG. 1 is formed.

Figure 18:
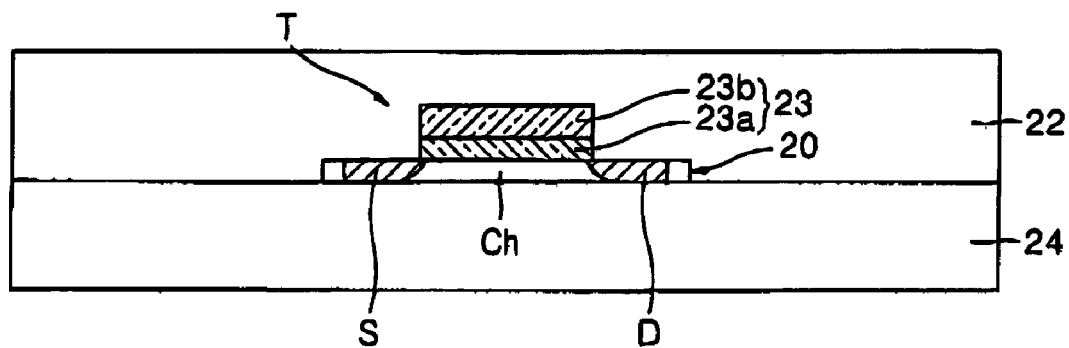

Specifically, referring to FIG. 18, a polysilicon layer 20 is formed on a predetermined portion of the second substrate 24. The second substrate 24 may be formed of the same substrate as the first substrate 10 of the capacitor part P1. In order to prevent formation of a natural oxide layer, the polysilicon layer 20 may be formed using an ultra high vacuum chemical vapor deposition. In this manner, the polysilicon layer 20 may be directly formed using such an apparatus. Also, the polysilicon layer 20 may be formed by crystallizing an amorphous silicon layer, which is grown on a predetermined portion of the second substrate 24. The gate stack structure 23 is formed on a predetermined portion of the polysilicon layer 20. The gate stack structure 23 may be formed by sequentially stacking the gate insulating layer 23a and the gate electrode 23b on a predetermined portion of the polysilicon layer 20. Then, a conductive impurity is injected into the polysilicon layer 20 around the gate stack structure, thereby forming the source region S and the drain region D. A portion of the polysilicon layer 20 below the gate stack structure 23 serves as the channel region Ch. In this manner, the switching element T is formed on the second substrate 24. The switching element T may be a transistor, e.g., a thin film transistor. The interlayer insulating layer 22 formed on the second substrate 24 covers the switching element T.

Figure 19:
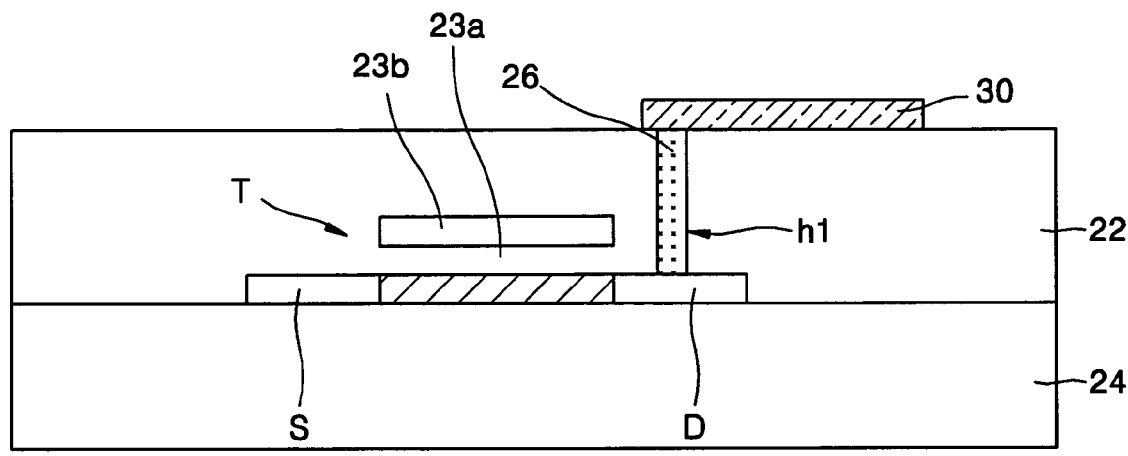

Referring to FIG. 19, a via hole h1 exposing the drain region D is formed in the interlayer insulating layer 22. The via hole h1 is filled with the conductive plug 26. The metal line 30 formed on the interlayer insulating layer 22 is connected to the conductive plug 26.

Figure 20:
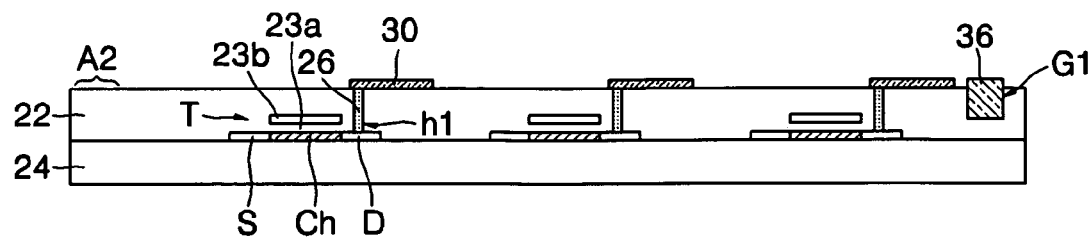

Although FIGS. 18 and 19 illustrate one switching element T formed on the second substrate 24, a plurality of switching elements T may be formed on the second substrate 24 at the same time, as shown in FIG. 20.

Referring to FIG. 20, a second alignment key (not shown) is formed on a second alignment key forming area A2 of the interlayer insulating layer 22 in order to align the capacitor part P1 and the switching element part P2. The second alignment key may be formed simultaneously with or independently from the metal line 30. The second alignment key may be formed on an edge portion of the interlayer insulating layer 22 in a predetermined shape, but its forming position is not limited to the edge portion. It is preferable that the second alignment key is formed in a shape to accurately match with the first alignment key, which is formed in the capacitor part P1. The second bonding pad 36 is formed on a predetermined portion spaced apart from the metal line 30 of the interlayer insulating layer 22. The second bonding pad 36 may be formed of the same material as the first bonding pad 18 of the capacitor part P1. The second bonding pad 36 may be formed at a position facing the first bonding pad 18. The second bonding pad 36 may be provided by forming a groove G1 having a predetermined depth in the predetermined portion of the interlayer insulating layer 22 and filling the groove G1 with a bonding material. Also, the second bonding pad 36 may be provided by forming a via hole at a position, in which the groove G1 of the interlayer insulating layer 22 is formed, and filling the via hole with a bonding material.

Thereafter, the capacitor part P1 and the switching element part P2 are aligned and bonded with each other.

Figure 21:
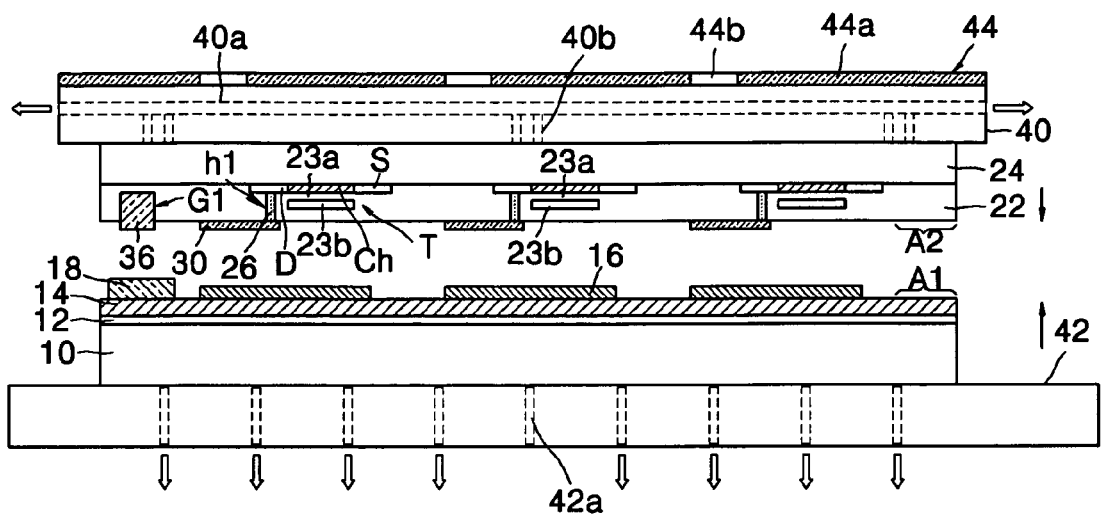

Specifically, referring to FIG. 21, a bottom surface of the second substrate 24 of the switching element part P2 is clamped to a first holder 40, which is transparent and has a vacuum clamping function. For the vacuum clamping, the first holder includes a vertical exhaust line 40b and a horizontal exhaust line 40a connected to the vertical exhaust line 40b. A mask 44 may further be provided on the upper surface of the first holder 40. When the second substrate 24 is a specific substrate, e.g., a glass substrate, the mask 44 may be used to bond the capacitor part P1 with the switching element part P2 using light 50, e.g., from an excimer laser. Thus, the mask 44 may be selectively provided depending on the material of the second substrate 24. The mask 44 includes a light shielding area 44a and a light transmitting area 44b. The light shielding area 44a shields the excimer laser light 50 and the light transmitting area 44b transmits the excimer laser light 50. The excimer laser light 50 is transmitted through the light transmitting area 44b to a region in which the capacitor part P1 and the switching element part P2 are in contact with each other, while remaining regions are protected by light shielding areas 44a.

A bottom surface of the capacitor part P1, i.e., a bottom of the first substrate 10, is clamped to a second holder 42 having a vacuum clamping function. For the vacuum clamping, the second holder 42 includes a vertical exhaust line 42a. When the switching element part P2 and the capacitor part P1 are respectively vacuum clamped to the first and second holders 40 and 42, the first holder 40 and the second holder 42 are moved relative to one another until the respective first and second alignment keys formed in the capacitor part P1 and the switching element part P2 are aligned. The first and second alignment keys may be accurately matched using a aligner, e.g., a track aligner, which is provided in the first and/or second holder(s) 40 and 42, thereby aligning the first and second bonding pads 18 and 36.

Figure 22:
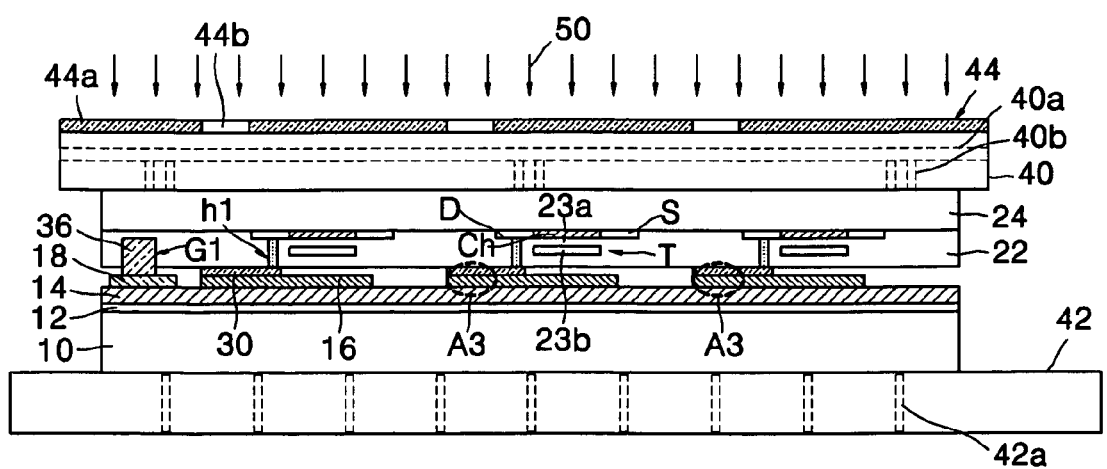

Referring to FIG. 22, after the alignment is complete, the first holder 40 and/or the second holder 42 are moved to bring the switching element part P2 and the capacitor part P1 into contact. The contact is achieved between the metal line 30 of the switching element part P2 and the second electrode 16 of the capacitor part P1. Then, a rapid thermal annealing process is performed on the resultant structure using a predetermined annealing apparatus that maintains an ultra high vacuum state. During the rapid thermal annealing process, the metal line 30 and the second electrode 16 are bonded to each other. Also, the first bonding pad 18 of the capacitor part P1 and the second bonding pad 36 of the switching element part P2, if used, are bonded to each other. In the rapid thermal annealing process, an annealing temperature depends on the material of the contact regions. For example, if the second electrode 16 is aluminum, the annealing temperature is about 650° C., while if the second electrode 16 is ITO, the annealing process is performed at a different temperature.

Since the first holder 40 is transparent, the second electrode 16 and the metal line 30 may be bonded by irradiating laser light 50, e.g., from an excimer laser (not shown), onto the contact area A3, instead of or in addition to the rapid thermal annealing process. The mask 44 may be provided on the first holder 40 to allow only the contact area A3 to be exposed to the laser light 50. The method of bonding with laser light 50 is especially useful when the second substrate 24 is transparent and formed of material having low absorption with respect to laser light 50, e.g., glass when the light is excimer laser light.

The rapid thermal annealing process and the laser method can be applied at the same time. For example, the second electrode 16 and the metal line 30 may be bonded using the thermal annealing apparatus while simultaneously providing the laser light 50 through the mask 44. In this case, a temperature of the thermal annealing process can be lowered and bonding time can be reduced.

Figure 23:
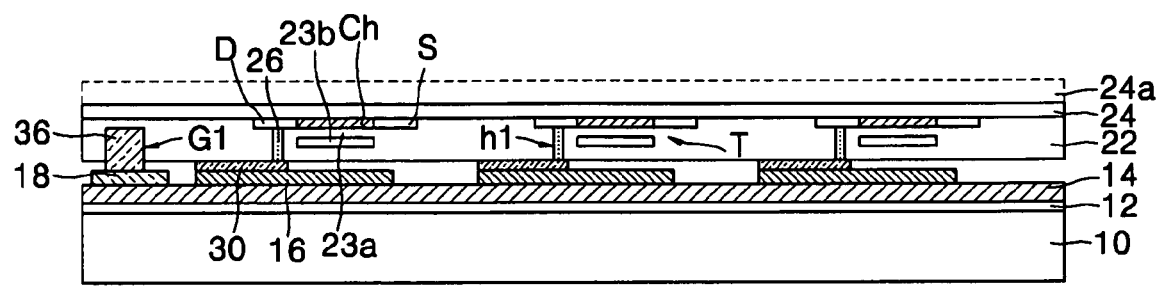

After the capacitor part P1 and the switching element part P2 are bonded with each other, the first and second holders 40 and 42 are removed. Referring to FIG. 23, an upper surface of the second substrate 24 is polished using a predetermined polishing apparatus, for example, a chemical mechanical polishing (CMP) apparatus. The polishing is performed until the second substrate 24 has a desired thickness. In FIG. 23, a reference numeral 24a represents the removed portion of the second substrate 24.

Figure 24:
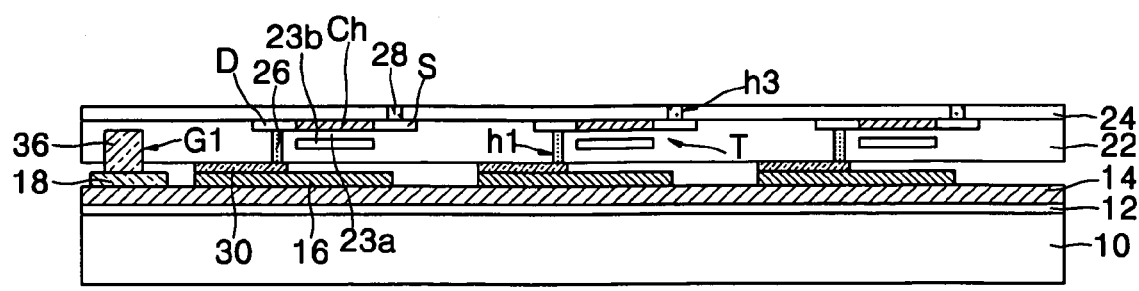
Figure 26:
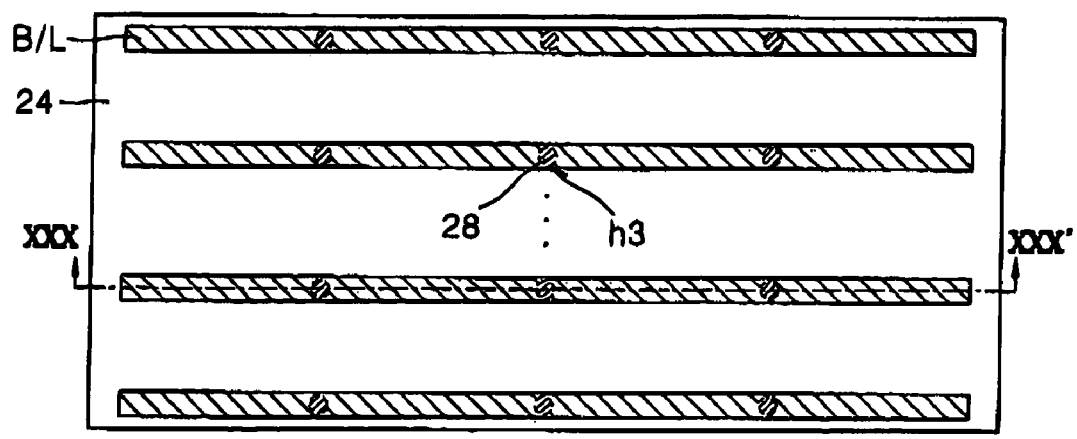
FIG. 26 illustrates a plan view of bit lines in a method of manufacturing the electronic device according to the first embodiment of the present invention.

Referring to FIG. 24, a via hole h3 exposing the source region S of the switching element T is formed in the second substrate 24. The via hole h3 is filled with the conductive plug 28. Then, the bit line B/L is formed on the upper surface of the second substrate 24 to contact the conductive plug 28, as shown in FIG. 1. Referring to FIG. 26, the bit lines B/L may be formed parallel to and spaced apart from each other by a predetermined interval.

Figure 25:
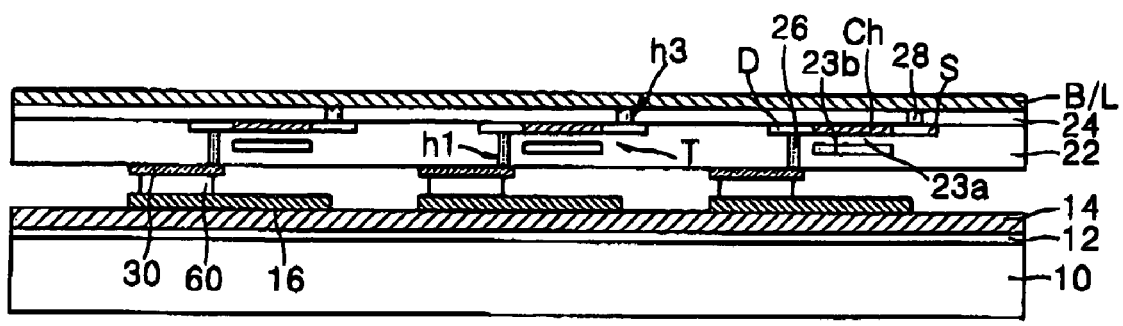
FIG. 25 illustrates a cross-sectional view of using a solder bump to secure a capacitor part and a switching element part in a method of manufacturing the electronic device according to the first embodiment of the present invention.

Referring to FIG. 25, the second electrodes 16 and the metal lines 30 can be bonded using a bonding material, e.g., solder bump 60, instead of the rapid thermal annealing process and/or the laser method. In this case, a sufficient bonding force between the second electrodes 16 and the metal lines 30 can be secured, and thus, the first bonding pad 18 of the capacitor part P1 and the second bonding pad 36 of the switching element part P2 are unnecessary.

SECOND METHOD EMBODIMENT

A second method embodiment relates to a method of stacking one or more second FRAM layers on the first FRAM layer formed using the method according to the first method embodiment of the present invention.

The second method embodiment may be performed in accordance with two variations. A first variation directly stacks the second FRAM layer on the first FRAM layer, and a second variation sequentially stacks the first and second FRAM layers, with an interlayer insulating layer interposed therebetween.

The first variation of the second method embodiment will now be described.

Figure 27:
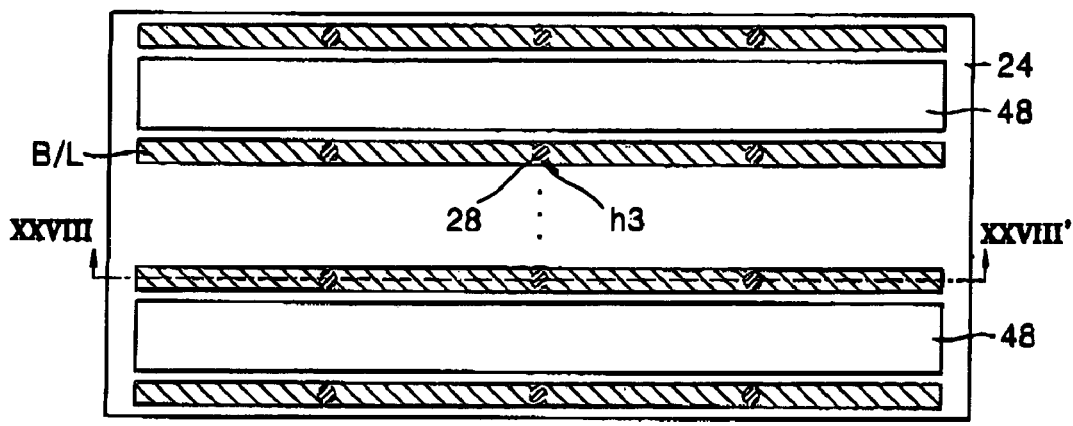
FIG. 27 illustrates a plan view of lower electrodes in a method of manufacturing the electronic device according to the first embodiment of the present invention.
Figure 28:
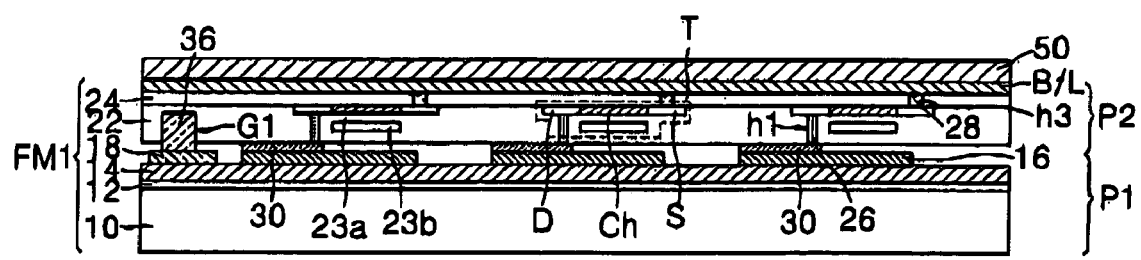
FIGS. 28 through 30 illustrate cross-sectional views of sequential stages of combining parts made using a method of manufacturing according to the first embodiment of the present invention in a method of manufacturing the electronic device according to a second embodiment of the present invention.

Referring to FIG. 27, lower electrodes 48 for the second FRAM layer are formed between the bit lines B/L on the second substrate 24. The lower electrodes 48 are formed as wide as possible to maximize the capacitance. The ferroelectric layer 50 covering the bit lines B/L and the lower electrodes 48 is formed on the second substrate 24. This process can be seen in FIG. 28, which illustrates a cross-sectional view taken along the line XXVIII-XXVIII' of FIG. 27.

Figure 29:
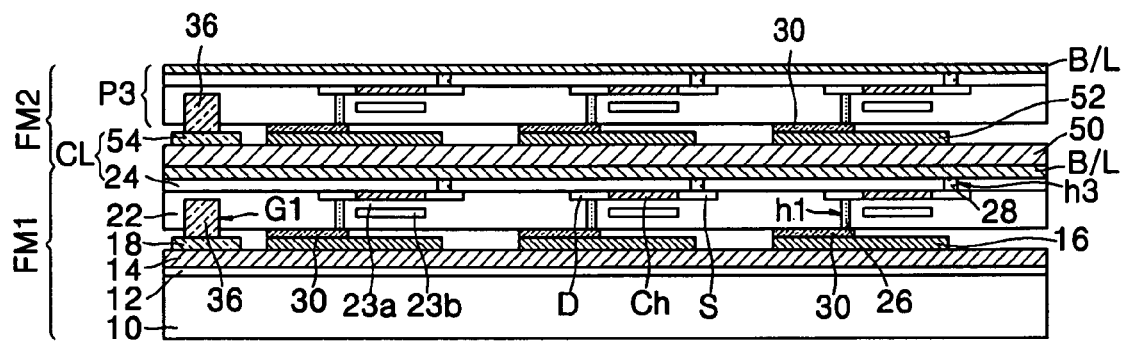

Referring to FIG. 29, upper electrodes 52 are formed on the ferroelectric layers 50, thereby providing the capacitor layer CL. The third bonding pad 54 is formed on an edge portion of the ferroelectric layer 50 together with the upper electrodes 52. The switching element part P3 including the plurality of switching elements T as described above is formed separately and then attached to the capacitor layer CL. Here, the second bonding pad 36 of the switching element part P3 and the third bonding pad 54 of the capacitor layer CL are attached to each other, and metal lines 30 of the switching element part P3 and the upper electrodes 52 of the capacitor layer CL are attached to each other. Such bonding is completed by contacting the switching element part P3 and the capacitor layer CL and heating the bonded resultant structure for a predetermined time at a predetermined temperature, e.g., about 150° C., while a predetermined pressure is applied to both sides of the switching element part P3 and the capacitor CL.

When the contact area between the metal lines 30 of the switching element part P3 and the upper electrodes 52 of the capacitor layer CL is large, the switching element part P3 and the capacitor layer CL can be firmly attached with only their own adhesive force. Thus, in this case, the second bonding pad 36 of the switching element part P3 and the third bonding pad 54 of the capacitor layer CL may not be formed.

Through these attaching processes, the second FRAM layer FM2 is completely formed on the first FRAM layer FM1. The bit lines B/L of the second FRAM layer FM2 may be formed as shown in FIG. 26.

Third and fourth FRAM layers may be further formed on the second FRAM layer FM2 by repeating the above process of forming the second FRAM layer FM2.

Next, the second variation of the second method embodiment in which an interlayer insulating layer is formed between first and second FRAM layers FM1 and FM2 is described.

Figure 30:
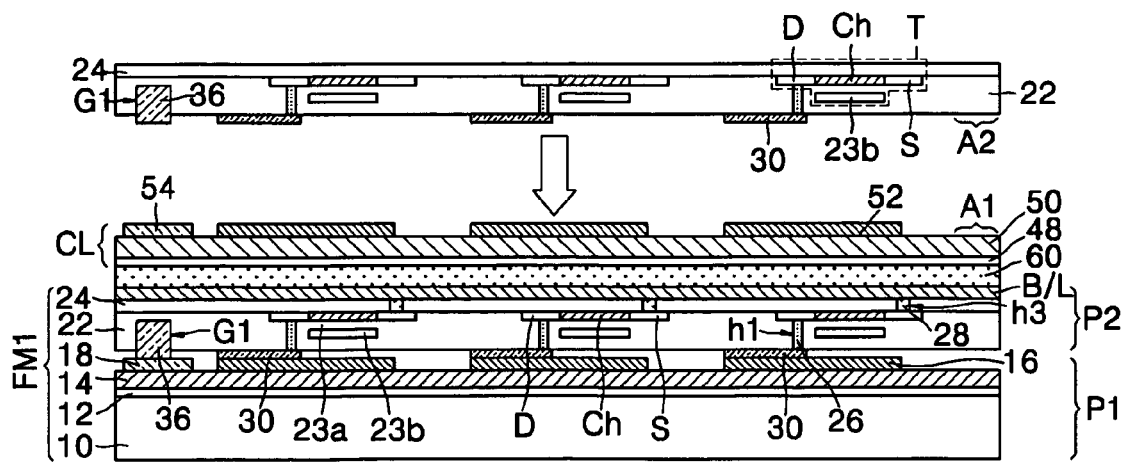

Referring to FIG. 30, the first FRAM layer FM1 is formed using the first method embodiment of the present invention. The interlayer insulating layer 60 covering the bit lines B/L (shown in FIG. 26) is formed on the second substrate 24. The lower electrode 48, the ferroelectric layer 50 and the upper electrode 52 are sequentially formed on the interlayer insulating layer 60. The third bonding pad 54 may be formed at the same time as the upper electrode 52. The upper electrode 52 and the lower electrode 48 are perpendicular to each other. Since the bit lines B/L are not formed on the interlayer insulating layer 60, the lower electrode 48 can be wider than the case of FIG. 27, in which the lower electrode 48 is between the bit lines B/L on the second substrate 24. In the capacitor layer CL, a reference numeral Al represents an area in which an alignment key is formed.

A switching element part P2, in which the bit lines B/L are not formed, is formed separately from the capacitor layer CL. The switching element part P2 in which the bit lines B/L are not formed is attached to the capacitor layer CL that is formed on the first FRAM layer FM1 in the same manner as forming the first FRAM layer FM1.

Figure 31:
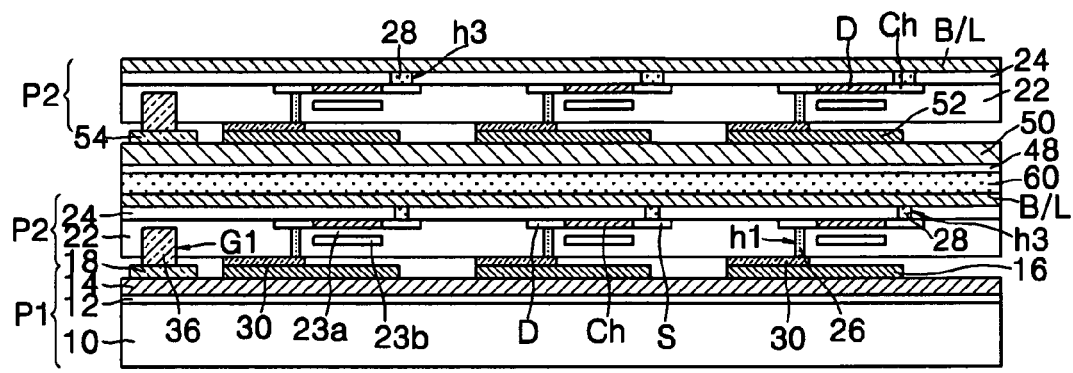
FIG. 31 illustrates a cross-sectional view of the electronic device according to the third embodiment of the present invention made using a method of manufacturing the electronic device according to the second embodiment of the present invention.

Referring to FIG. 31, the via hole h3 exposing the source region S is formed in the second substrate 24. The via hole h3 is filled with the conductive plug 28. Bit lines B/L formed on the second substrate 24 contact the conductive plug 28.

The above-described second variation is actually relates to a method of manufacturing the FRAM shown in FIG. 4 according to the third device embodiment of the present invention.

THIRD METHOD EMBODIMENT

A third method embodiment relates to a method of manufacturing the FRAM of FIG. 10 according to the fourth device embodiment of the present invention.

Figure 32:
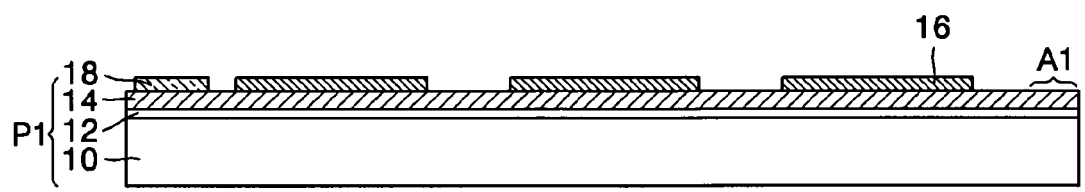
FIGS. 32, 33 and 36-38 illustrate cross-sectional views of stages of a method of manufacturing the electronic device according to the fourth embodiment of the present invention.

Referring to FIG. 32, in the same manner as the first variation of the second method embodiment, first electrodes 12, the ferroelectric layer 14 and second electrodes 16 are sequentially formed on the first substrate 10, thereby forming the capacitor part P1. In the process of forming the capacitor part P1, a first alignment key is formed on the first alignment key forming area A1 to match with a second alignment key of the switching element part P2. The first bonding pad 18 may be formed at the same time as the second electrodes 16.

Figure 33:
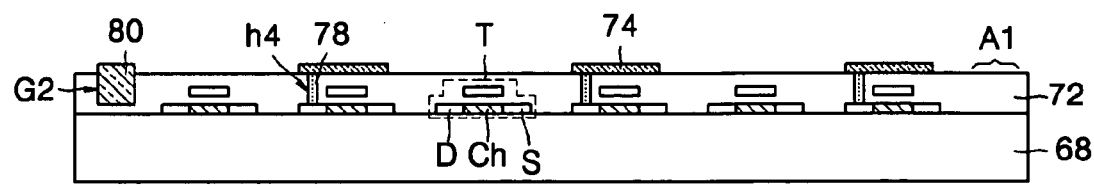

Referring to FIG. 33, the plurality of switching elements T are formed on a separate third substrate 68. The second alignment key is also formed on the second alignment key forming area A2 of the third substrate 68. The interlayer insulating layer 72 formed on the third substrate 68 covers the switching elements T. The via hole h4 exposing the drain region D of the switching elements T is formed in the interlayer insulating layer 72. The number of via holes h4 is equal to half the switching elements T. In other words, the via holes h4 are not formed for all the switching elements T, but in every other switching element. Then, the via holes h4 are filled with conductive plugs 78. During the formation of the via holes h4, a groove G2 having a predetermined depth is formed in a predetermined area, e.g., an edge portion, of the interlayer insulating layer 72. The groove G2 is filled with the fourth bonding pad 80, which will be bonded with the first bonding pad 18 of the capacitor part P1. The fourth bonding pad 80 is formed to protrude out of the interlayer insulating layer 72. A metal line (not shown) that is in contact with the conductive plug 78 is formed on the interlayer insulating layer 72 and is patterned using a photolithography process. As a result, a metal line 74 that is in contact with the conductive plug 78 is formed on the interlayer insulating layer 72. In this manner, the switching element part P4 is formed.

Figure 34:
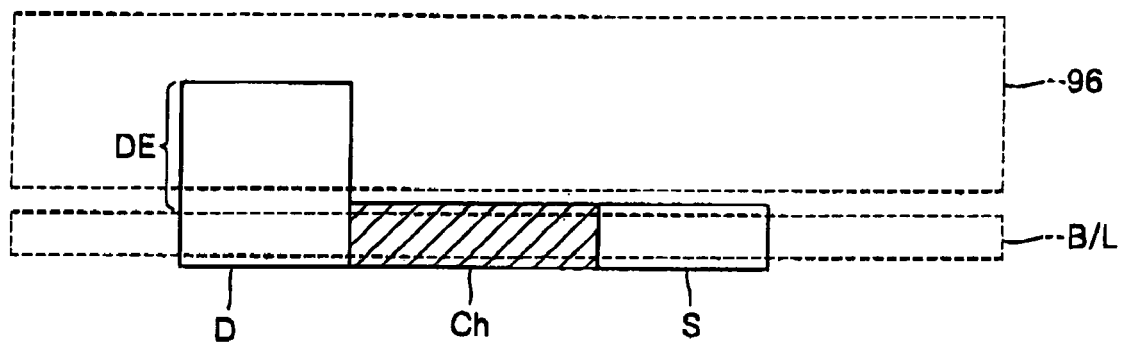
FIGS. 34 and 35 illustrate plan views of variations on the typical switching element.

In order to prevent contact between the bit line and the lower electrode in the following processes, the drain region D of the switching element T may have an expanded portion DE, which extends in a direction perpendicular to the channel region Ch, as shown in FIG. 34. In this case, the bit line B/L, which will be formed in the following processes, may be formed crossing over the whole switching element T except for the expanded portion DE of the drain region D. The lower electrode 96 may cover the expanded portion DE of the drain region D, while not contacting the bit line B/L and also in parallel with the bit line B/L. Thus, the bit line B/L and the lower electrode 96 are isolated from each other.

Figure 35:
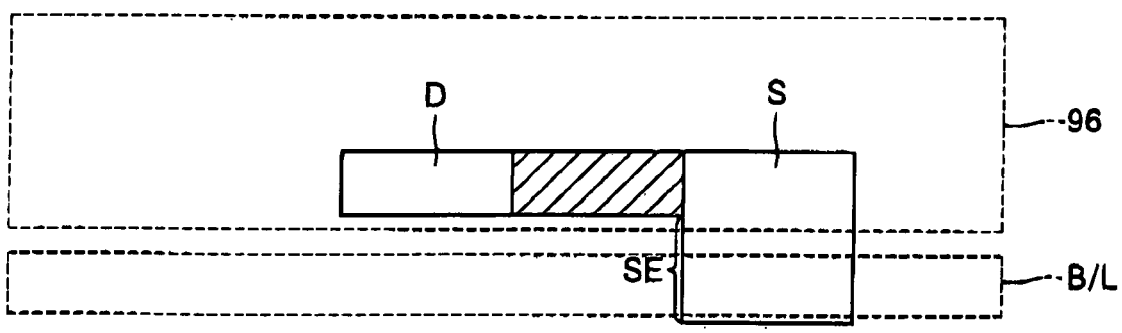

Referring to FIG. 35, as an alternative to the configuration shown in FIG. 34, the source region S of the switching element T may have an expanded portion SE, which extends in a direction perpendicular to the channel region Ch, while the drain region D has no expanded portion. In this case, the bit line B/L, which will be formed in the following processes, covers the expanded portion BE of the source region S, and the lower electrode 96 covers the entire switching element T, except for the expanded portion SE of the source region S, while not contacting the bit line B/L. Thus, again, the bit line B/L and the lower electrode 96 are isolated from each other.

Figure 36:
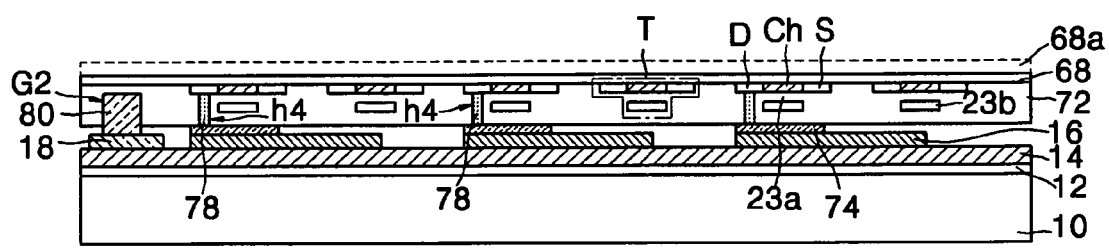

Referring to FIG. 36, the switching element part P4 of FIG. 33 is attached to the capacitor part P1 of FIG. 32. Their attachment follows the above-described method of bonding the capacitor part P1 and the switching element part P2. After the thin film transistor layer is attached to the capacitor part P1, a rear surface of the third substrate 68 may be polished to make the third substrate 68 have a desired thickness. A reference numeral 68a represents a region of the third substrate 68 removed during the polishing process.

Figure 37:
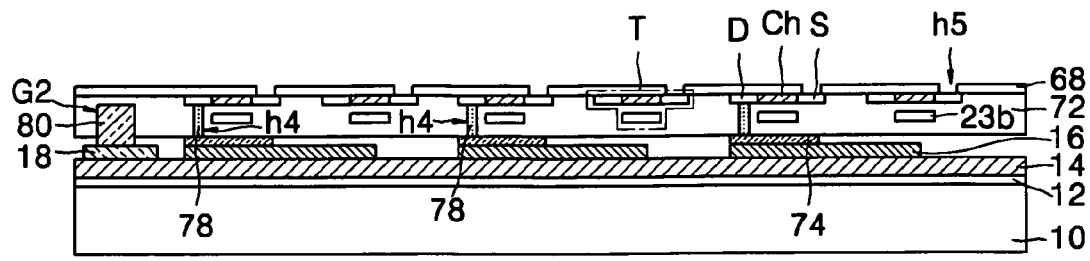
Figure 38:
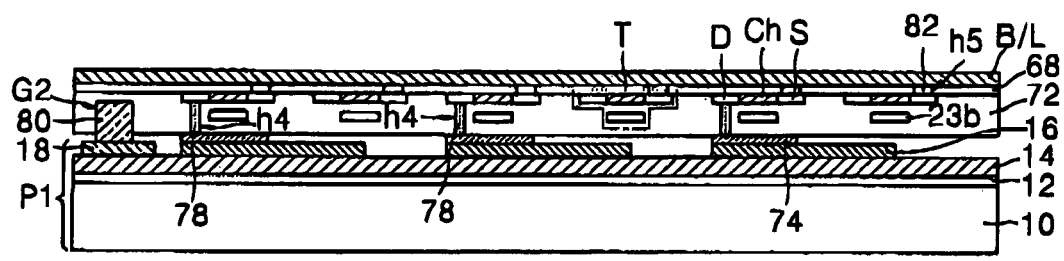

Referring to FIG. 37, a via hole h5 exposing the source region S of the switching element T is formed in the polished third substrate 68. Referring to FIG. 38, the via hole h5 is filled with the conductive plug 82. The bit line B/L covering the conductive pug 82 is formed on the third substrate 68. FIG. 38 illustrates a cross-sectional view taken along the line XXXVIII-XXXVIII' of FIG. 39.

The switching element T may be formed in various configurations. For example, although the drain and source regions may be formed as a typical structure, one of the drain and source regions may be expanded, as shown in FIGS. 34 and 35, respectively.

The bit line B/L may be formed to have various layouts, taking into account the relationship between the various configurations of the switching element and the lower electrode, which will be formed in the following processes.

Figure 39:
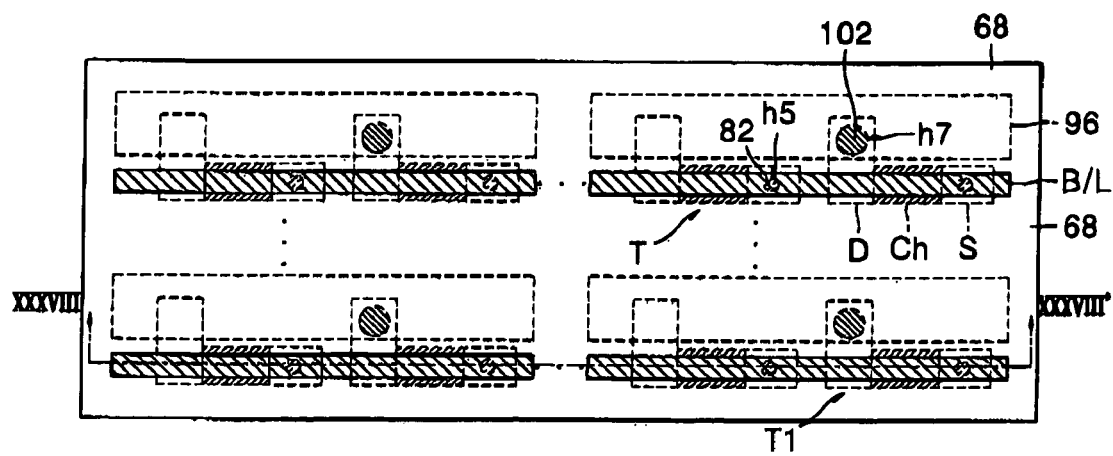
FIGS. 39-41 illustrate plane views of variations of the structure of bit lines, drain regions and lower electrodes.

For example, referring to FIG. 39, when the drain region D of the switching element T is expanded, the bit line B/L may be formed over the remaining drain region D except for the expanded portion, the channel region Ch, and the source region S. It is preferable that the lower electrode 96 of the capacitor, which will be formed in the following processes, is in contact with the expanded portion of the drain region D of the switching element T1, which is not connected with the capacitor part P1. For this purpose, a via hole h7 exposing the expanded portion of the drain region D of switching element T1 is formed in the third substrate 68. Then, the via hole h7 is filled with a conductive plug 102. The lower electrode 96 is formed to be in contact with the conductive plug 102.

Figure 43:
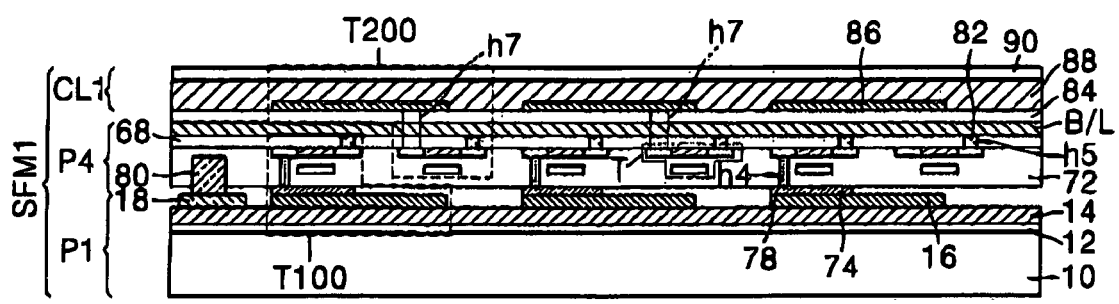
FIG. 43 illustrates a cross-sectional view of an electronic device according to the fifth embodiment of the present invention having an interlayer insulating layer between a thin film transistor layer and an upper capacitor layer.

Referring to FIG. 43, when the interlayer insulating layer 84 is formed between the switching element part P4 and the upper capacitor layer CL1, the via hole h7 is formed through the interlayer insulating layer 84.

In a case where the switching element has a typical configuration, i.e., when neither the drain region nor the source region of the switching element is expanded, the bit line B/L may be formed in at least two varations.

Figure 40:
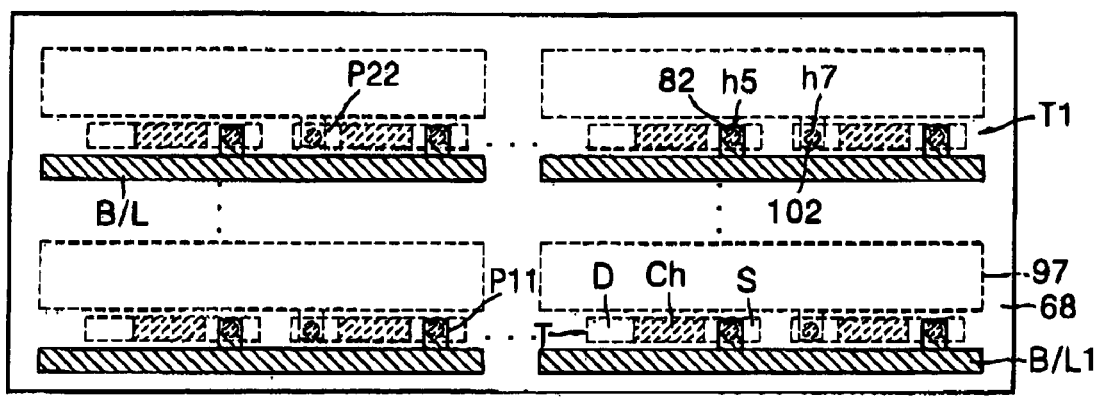

In a first variation of forming a bit line, referring to FIG. 40, the bit lines B/L1 may be formed at a position spaced apart from and parallel to adjacent switching elements T and T1. Here, protrusions P11 are formed in the bit lines B/L1 facing the source regions S. The bit lines B/L1 are connected to the source regions S through the protrusions P11. The lower electrodes 97 that are spaced apart from and parallel to the switching elements T and T1 are formed at the opposite side of the switching elements T and T1 from the bit lines B/L1. In this process, protrusions P22 are formed in the lower electrodes 97 facing the drain regions D of the switching elements T1, i.e., those switching elements that are not connected to the capacitor part P1. The lower electrodes 97 are connected to the drain regions D of the switching elements T1 through the protrusions P22 and the conductive plugs 102.

As can be seen in FIG. 40, since the switching elements T connected to the capacitor part P1 are not connected to the lower electrodes 97, no via holes for the contact of the switching elements T and the lower electrode 97 are formed in the third substrate 68. Thus, the lower electrodes 97 can extend over the third substrate 68, which is provided above the switching elements T, while remaining isolated from the bit lines B/L1. As a result, an area of the lower electrode 97 increases.

Figure 41:
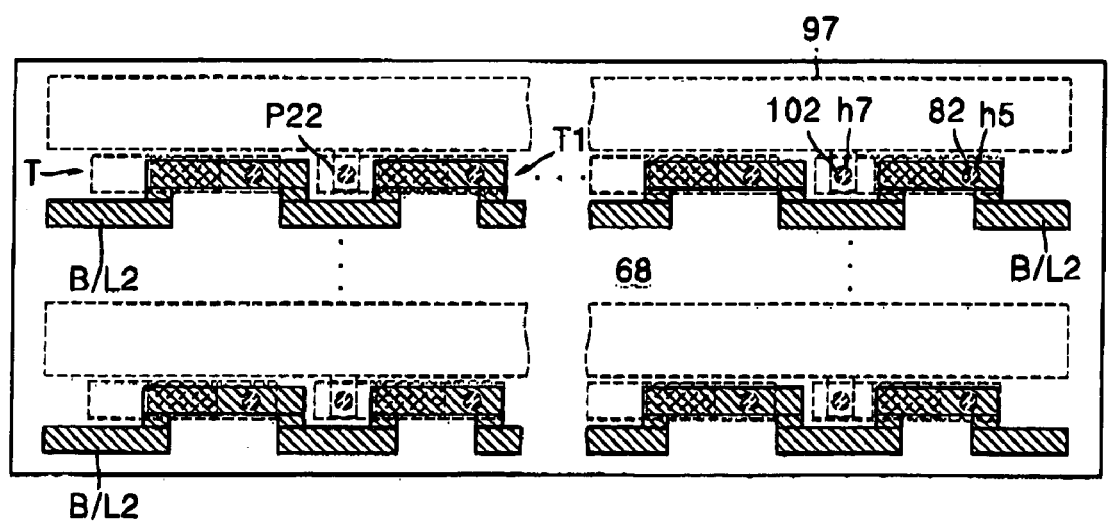

In a second variation for forming the bit lines, referring to FIG. 41, the bit lines B/L2 may be formed over the switching elements T and T1, while detouring around the drain regions D of the switching elements T and T1. In this case, the lower electrodes 97 are formed with the protrusion P22 as shown in FIG. 40.

In FIG. 41, the layouts of the lower electrodes 97 and the bit lines B/L2 may be exchanged. For example, the bit lines B/L2 may be formed with the protrusion P11 as shown in FIG. 40, and the lower electrodes 97 may be over the switching elements T and T1 while detouring around the source regions S.

The above-described first and second variations can be used when the bit lines B/L and the lower electrodes 96 or 97 are formed on the same plane, i.e., on the third substrate 68, and when the bit lines B/L and the lower electrodes 96 or 97 are formed on different planes, i.e., have the interlayer insulating layer 84 interposed therebetween.

Referring to FIG. 38, after the bit lines B/L are formed on the third substrate 68, the lower electrodes (not shown) are formed on the third substrate 68 between the bit lines B/L. In other words, the bit lines B/L and the lower electrodes are formed on the third substrate 68 together. The bit lines B/L may be the bit lines B/L1 having the protrusions P11 of FIG. 40 or the bit lines B/L2 may detour around the drain regions D.

Figure 42:
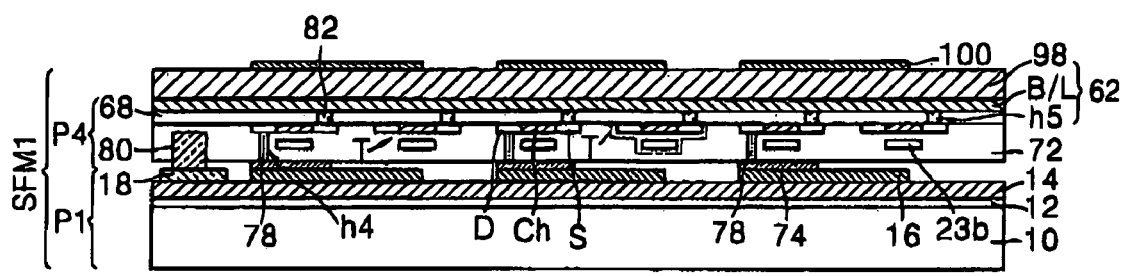
FIG. 42 illustrates a cross-sectional view of a stacked electronic device according to the fourth embodiment of the present invention.

Referring to FIG. 42, a ferroelectric layer 98 covering the bit lines B/L and the lower electrodes is formed on the third substrate 68. Upper electrodes 100 are formed on the ferroelectric layer 98. The upper electrodes 100 are perpendicular to the lower electrodes.

In this manner, the first stacked FRAM layer SFM1 including a plurality of vertically stacked nonvolatile memory cells are formed.

A side view of a stacked structure indicated by a reference numeral B2 in FIG. 42 is shown in FIG. 14. Referring to FIG. 14, it can be appreciated that the bit lines B/L, B/L1 or B/L2 and the lower electrodes 96 or 97 are formed on the third substrate 68.

Figure 44:
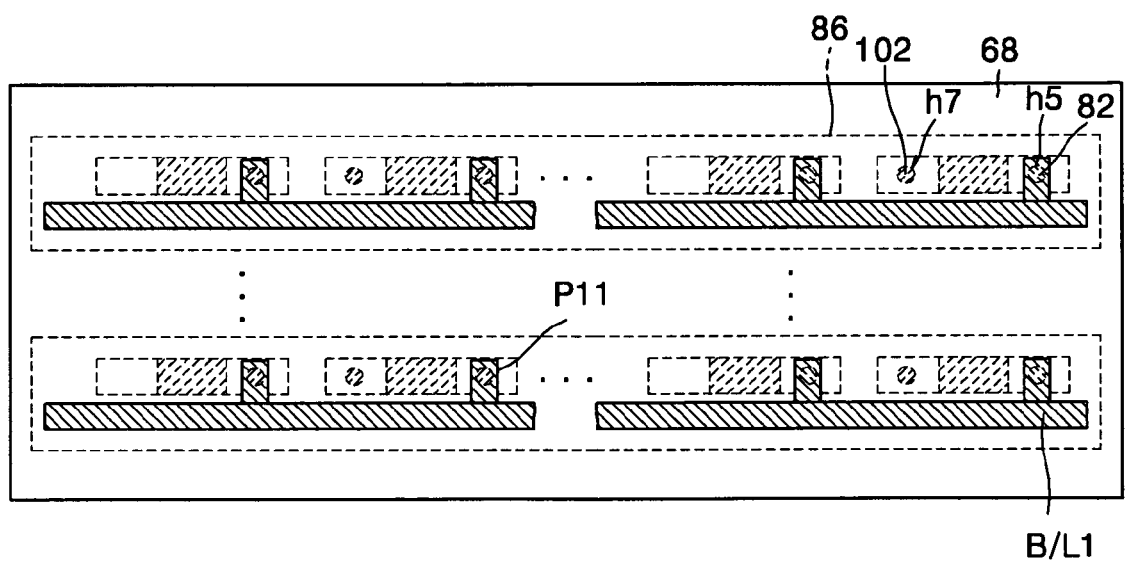
FIG. 44 illustrates a plan view of a case of overlapping bit lines and lower electrodes of an upper capacitor layer in the electronic device of FIG. 43.

Referring to FIG. 43, the interlayer insulating layer 84 may be further formed between the capacitor layer CL1 and the switching element part P4 of the first stacked FRAM layer SFM1. In this case, the lower electrodes 86 and the bit lines B/L may be formed as shown in FIGS. 39 through 41. Also, the lower electrodes 86 may be formed just above the bit lines B/L1, as shown in FIG. 44. The bit lines B/L1 of FIG. 44 can be replaced with the bit lines B/L2 of FIG. 42.

Meanwhile, the second stacked FRAM layer SFM2 of FIG. 15 may be further formed on the first stacked FRAM layer SFM1 of FIG. 42 or FIG. 43. Also, third and fourth stacked FRAM layers may be further formed on the second stacked FRAM layer SFM2.

When one or more of the same FRAM layers are further stacked on the first FRAM layer FM1 or the first stacked FRAM layer SFM1, the two FRAM layers may be aligned using the alignment key, which is formed on a rear surface of a base substrate, e.g., the first substrate 10, and then, the two FRAM layers are attached to each other. The processes of forming the alignment key on the rear surface of the base substrate and aligning the FRAM layers using the alignment key can be used for stacking the two FRAM layers, the capacitor part P1 and the switching element part P2 of the first FRAM layer FM1, or the capacitor part P1 and the switching element part P4 of the first stacked FRAM layer SFM1.

Further, the solder bump may be used to secure the capacitor part P1 and the switching element part P2 of the first FRAM layer FM1 or the capacitor part P1 and the switching element part P4 of the first stacked FRAM layer SFM1.

In the above-described methods, after the bonding of a capacitor part and a switching element part of an FRAM layer is completed, the edges of both parts are sealed. The sealing process can also be applied to the stacked structure. Also, if necessary, the sealing can be performed at a pressure lower than the atmospheric pressure. In this manner, it is possible to remove gases that exist between the capacitor part P1 and the switching element part P2.

In the manufacture of the FRAM including the switching element part and the capacitor part, which respectively has the thin film transistors and the ferroelectric capacitors, the capacitor part and the switching element part are formed separately and the resultant structures are then bonded with each other.

The method of manufacturing the FRAM according to the present invention can simplify the manufacturing processes and reduce the manufacturing cost. Also, since the high temperature process for the crystallization of the ferroelectric layer may be performed only to the capacitor part, a diffusion barrier layer is unnecessary. Thus, the problem arising from the oxidation of the diffusion barrier layer can be eliminated. As a result, a high quality FRAM can be obtained. Further, since the FRAM according to the present invention can be provided in a stacked structure, a degree of integration is increased. Furthermore, since the thin film transistors and the ferroelectric capacitors are formed on the transparent substrate, e.g., the sapphire substrate, the FRAM may be made transparent, thereby allowing multi-functional devices to be realized. For example, when the present invention is applied to a smart card, the smart card is made transparent so that some region of the smart card can be used as a display. Furthermore, since the FRAM according to the present invention is flexible and transparent, its application can be more widespread. For example, the FRAM according to the present invention can be used in a radio frequency identification (RFID) system.

Exemplary embodiments of the present invention have been disclosed herein, and although specific terms are employed, they are used and are to be interpreted in a generic and descriptive sense only and not for purpose of limitation. For example, bottom gate thin film transistors can be used instead of top gate thin film transistors as the switching element. Also, the present invention can be applied to RAM consisting of a thin film transistor and a capacitor, in which a general dielectric layer is used. Accordingly, it will be understood by those of ordinary skill in the art that various changes in form and details may be made without departing from the spirit and scope of the present invention as set forth in the following claims.

What is claimed is:

1. A ferroelectric random access memory (FRAM), comprising:
a lower PRAM including
a first substrate;
a first lower capacitor on the first substrate;
a first lower switching element on the first lower capacitor;
a second substrate on the first lower switching element;
a first bit line on the second substrate of the lower FRAM, the first bit line being connected to the first lower switching element of the lower FRAM; and
an upper FRAM on the second substrate of the lower FRAM, the upper FRAM including a first upper capacitor having a lower electrode spaced apart from the first bit line and a first upper switching element on the first upper capacitor.

2. The FRAM as claimed in claim 1, wherein the first lower capacitor comprises a first electrode, a ferroelectric layer and a second electrode, which are sequentially stacked on the first substrate, the second electrode being perpendicular to the first electrode.

3. The FRAM as claimed in claim 1, wherein the first lower switching element is a thin film transistor.

4. The FRAM as claimed in claim 1, further comprising a metal line between the first lower capacitor and the first lower switching element, the metal line bonding the first lower capacitor to the first lower switching element.

5. The FRAM as claimed in claim 4, wherein the metal line and the first lower switching element are connected to each other through a conductive plug.

6. The FRAM as claimed in claim 4, further comprising a solder bump between the metal line and the first lower capacitor.

7. The FRAM as claimed in claim 1, further comprising an interlayer insulating layer, the first lower switching element being provided inside the interlayer insulating layer, and a bonding pad on each of the interlayer insulating layer and the first lower capacitor.

8. The FRAM as claimed in claim 1, further comprising a second lower switching element between the first substrate and the second substrate.

9. The FRAM as claimed in claim 8, wherein the first lower capacitor is expanded between the first substrate and the second lower switching element, the first lower capacitor being isolated from the second lower switching element.

10. The FRAM as claimed in claim 8, wherein the first lower switching element is identical to the second lower switching element.

11. The FRAM as claimed in claim 1, wherein the first upper capacitor is identical to the first lower capacitor.

12. The FRAM as claimed in claim 1, wherein the first upper switching element is identical to the first lower switching element.

13. The FRAM as claimed in claim 1, wherein the lower electrode of the first upper capacitor is provided on the second substrate and extends over the second substrate along a same plane along which the first bit line extends, the plane being substantially parallel with a plane along which the second substrate extends.

14. The FRAM as claimed in claim 1, further comprising an interlayer insulating layer between the lower electrode of the first upper capacitor and the second substrate, the interlayer insulating layer covering the first bit line.

15. The FRAM as claimed in claim 1, further comprising a metal line between the first upper capacitor and the first upper switching element, the metal line bonding the first upper capacitor to the first upper switching element.

16. The FRAM as claimed in claim 15, further comprising a conductive plug connecting the metal line and the first upper switching element.

17. The FRAM as claimed in claim 1, wherein the first upper switching element is formed inside an interlayer insulating layer, and each of the interlayer insulating layer and the first upper capacitor includes a bonding pad.

18. The FRAM as claimed in claim 1, further comprising a third substrate on the first upper switching element.

19. The FRAM as claimed in claim 18, further comprising a second bit line on the third substrate, the second bit line being connected to the first upper switching element.

20. A ferroelectric random access memory (FRAM), comprising:
a first substrate;
a first lower capacitor on the first substrate;
a first lower switching element on the first lower capacitor;
a second substrate on the first lower switching element;
a second lower switching element between the first substrate and the second substrate;
a first bit line on the second substrate, the first bit line being connected to the first lower switching element; and
an upper capacitor on the second substrate, the upper capacitor including a lower electrode that is isolated from the first bit line and is connected to the second lower switching element and the second substrate being disposed between the upper capacitor and the first lower capacitor.

21. The FRAM as claimed in claim 20, wherein the first bit line is further connected to the second lower switching element.

22. The FRAM as claimed in claim 20, wherein the lower electrode of the upper capacitor is provided on the second substrate and extends over the second substrate along a same plane along which the first bit line extends, the plane being substantially parallel with a plane along which the second substrate extends.

23. The FRAM as claimed in claim 20, wherein an area in which the first and second lower switching elements are connected to the first bit line has an expanded portion, and the first bit line passes over the expanded portion.

24. The FRAM as claimed in claim 20, wherein an area in which the second lower switching element is connected to the upper capacitor has an expanded portion, and the lower electrode passes over the expanded portion.

25. The FRAM as claimed in claim 20, further comprising a protrusion in the first bit line, wherein the first bit line is connected to the first and second lower switching elements through the protrusion.

26. The FRAM as claimed in claim 20, further comprising a protrusion in the lower electrode of the upper capacitor, wherein the lower electrode of the upper capacitor is connected to the second lower switching element through the protrusion.

27. The FRAM as claimed in claim 20, wherein the first bit line passes over the first and second lower switching elements and detours around a region in which the lower electrode of the upper capacitor and the second lower switching element are connected to each other.

28. The FRAM as claimed in claim 20, further comprising an interlayer insulating layer between the lower electrode of the upper capacitor and the second substrate, the interlayer insulating layer covering the first bit line.

29. The FRAM as claimed in claim 28, wherein the lower electrode of the upper capacitor is parallel to the first bit line and passes over the first bit line.

30. The FRAM as claimed in claim 20, further comprising an upper FRAM on the upper capacitor, the upper FRAM being isolated from the upper capacitor.

31. The FRAM as claimed in claim 30, wherein the upper FRAM comprises:
   a first capacitor; and
   a first switching element stacked on the first capacitor.

32. The FRAM as claimed in claim 30, further comprising a third substrate on the first switching element.

33. The FRAM as claimed in claim 32, further comprising:
   a second switching element between the third substrate and the first capacitor, the second switching being isolated from the first capacitor;
   a second bit line on the third substrate and connected to the first and second switching elements; and
   a second capacitor on the third substrate and connected to the second switching element, the second capacitor being isolated from the second bit line.

34. A method of manufacturing a ferroelectric random access memory (FRAM), comprising:
   (a) forming a first capacitor on a first surface of a first substrate;
   (b) forming a first switching element on a first surface of a second substrate;
   (c) bonding the first capacitor to the first switching element;
   (d) forming a first bit line on a second surface of the second substrate, the first bit line being connected to the first switching element; and
   (e) forming an FRAM layer on the second surface of the second substrate such that the second substrate is between the first capacitor and the FRAM layer, the FRAM layer including an upper capacitor having a lower electrode spaced apart from the first bit line and an upper switching element on the upper capacitor.

35. The method as claimed in claim 34, wherein forming the first capacitor comprises:
   forming a first electrode on the first surface of the first substrate;
   forming a ferroelectric layer on the first electrode; and
   forming a second electrode on the ferroelectric layer, the second electrode being crossed with the first electrode.

36. The method as claimed in claim 35, further comprising forming a first bonding pad and a first alignment key on the ferroelectric layer.

37. The method as claimed in claim 34, further comprising, between forming the first switching element and the bonding of the first capacitor to the first switching element:
   forming an interlayer insulating layer on the first surface of the second substrate, the interlayer insulating layer covering the first switching element;
   forming a via hole in the interlayer insulating layer, the via hole exposing the first switching element;
   filling the via hole with a conductive plug; and
   forming a metal line on the interlayer insulating layer, the metal line being connected to the conductive plug.

38. The method as claimed in claim 37, wherein forming the via hole comprises forming a second bonding pad and a second alignment key.

39. The method as claimed in claim 34, wherein bonding the first capacitor to the first switching element comprises:
   clamping a second surface of the first substrate, the second surface of the first substrate facing the first surface thereof;
   clamping a second surface of the second substrate, the second surface of the second substrate facing the first surface thereof;
   aligning the first and second substrates to dispose the first capacitor and the first switching element at a bonding position;
   pressurizing and contacting the first capacitor and the first switching element;
   heating the pressurized and contacted portion of the first capacitor and the first switching element; and
   releasing the second surfaces of the first and second substrates.

40. The method as claimed in claim 39, further comprising annealing the pressurized and contacted resultant structure in an ultra high vacuum state, thereby heating the pressurized and contacted portion of the first capacitor and the first switching element.

41. The method as claimed in claim 39, further comprising irradiating the contacted portion of the first capacitor and the first switching element, thereby heating the contacted portion of the first capacitor and the first switching element.

42. The method as claimed in claim 41, further comprising providing a mask between a light source used for irradiating and the second surface of the second substrate, the mask including a light transmitting area, which corresponds to the contacted portion, and a light shielding area which corresponds to other areas.

43. The method as claimed in claim 34, wherein forming the FRAM layer on the second surface of the second substrate comprises forming the FRAM layer to be isolated from the bit line.

44. The method as claimed in claim 43, wherein forming the FRAM layer comprises:
   forming the upper capacitor on the second face of the second substrate isolated from the bit line; and
   forming the upper switching element on the upper capacitor.

45. The method as claimed in claim 44, further comprising an interlayer insulating layer between the upper capacitor and the second surface of the second substrate, the interlayer insulating layer covering the bit line.

46. The method as claimed in claim 44, forming a lower electrode of the upper capacitor on the second surface of the second substrate, the lower electrode being isolated from the bit line.

47. The method as claimed in claim 39, further comprising, after the releasing, thinning at least one of the first substrate and the second substrate.

48. The method as claimed in claim 34, wherein bonding the first capacitor and the first switching element comprises using a solder bump.

49. A method of manufacturing a ferroelectric random access memory (FRAM), comprising:
   (a) forming a first capacitor on a first surface of a first substrate;
   (b) forming a first switching element on a first surface of a second substrate;
   (c) bonding the first capacitor to the first switching element;
   (d) forming a second switching element between the first substrate and the second
   (e) forming a first bit line on a second surface of the second substrate, the first bit line being connected to the first switching element; and (f) forming an upper capacitor on the second surface of the second substrate such that the second substrate is between the upper capacitor and the first capacitor, the upper capacitor including a lower electrode that is isolated from the bit line and is connected to the second switching element.

50. The method as claimed in claim 49, further comprising forming the second switching element on the first surface of the second substrate.

51. The method as claimed in claim 49, further comprising forming the first bit line being connected to the second switching elements.

52. The method as claimed in claim 51, further comprising forming an interlayer insulating layer between the upper capacitor and the second surface of the second substrate, the interlayer insulating layer covering the bit line.

53. The method as claimed in claim 51, further comprising:
   forming an interlayer insulating layer on the upper capacitor; and
   forming an FRAM layer on the interlayer insulating layer.

54. The method as claimed in claim 53, wherein forming the FRAM layer comprises:
   forming a capacitor on the interlayer insulating layer;
   forming a switching element on a first surface of a third substrate; and
   bonding the switching element to the capacitor.

55. The method as claimed in claim 53, wherein forming the FRAM layer comprises:
   forming a lower capacitor on the interlayer insulating layer;
   forming a first switching element to be connected to the lower capacitor and a second switching element to be isolated from the lower capacitor on a first surface of a third substrate;
   bonding the first switching element to the lower capacitor;
   forming a second bit line on a second surface of the third substrate, the second surface of the third substrate facing the first surface thereof, the second bit line being connected to the first and second switching elements; and
   forming a second upper capacitor on the second surface of the third substrate, the second upper capacitor being connected to the second switching element, a lower electrode of the second upper capacitor being isolated from the second bit line.

56. The method as claimed in claim 55, wherein bonding the first switching element to the lower capacitor comprises contacting a metal line connected to the first switching element through a conductive plug to the lower capacitor.

* * * * *